(12) United States Patent
Horak et al.

(10) Patent No.: US 8,354,703 B2
(45) Date of Patent: Jan. 15, 2013

(54) SEMICONDUCTOR CAPACITOR

(75) Inventors: David Vaclav Horak, Essex Junction, VT (US); Shom Ponoth, Albany, NY (US); Hosadurga Shobha, Albany, NY (US); Chih-Chao Yang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/165,191

(22) Filed: Jun. 21, 2011

(65) Prior Publication Data

US 2012/0012980 A1 Jan. 19, 2012

Related U.S. Application Data

(63) Continuation-in-part of application No. 12/837,121, filed on Jul. 15, 2010, now abandoned.

(51) Int. Cl.
 *H01L 29/92* (2006.01)
(52) U.S. Cl. .. 257/306; 257/309; 257/534; 257/E29.342
(58) Field of Classification Search .................. 257/306, 257/309, 532, 534, E29.342; 438/396, 397
 See application file for complete search history.

(56) References Cited

U.S. PATENT DOCUMENTS

| | | | |
|---|---|---|---|
| 5,244,824 A * | 9/1993 | Sivan | 438/245 |
| 5,744,833 A * | 4/1998 | Chao | 257/308 |
| 5,770,499 A * | 6/1998 | Kwok et al. | 438/253 |
| 5,976,990 A | 11/1999 | Mercaldi et al. | |
| 6,048,764 A | 4/2000 | Suzuki et al. | |
| 6,831,319 B2 | 12/2004 | Zheng | |
| 7,253,053 B2 | 8/2007 | Eppich et al. | |
| 7,271,055 B2 | 9/2007 | Lee et al. | |
| 7,416,954 B2 * | 8/2008 | Block et al. | 438/397 |
| 7,563,715 B2 | 7/2009 | Haukka et al. | |
| 7,666,737 B2 * | 2/2010 | Tu | 438/254 |
| 7,666,752 B2 * | 2/2010 | Kudelka et al. | 438/381 |
| 2004/0013803 A1 | 1/2004 | Chung et al. | |
| 2007/0007571 A1 | 1/2007 | Lindsay et al. | |
| 2007/0059447 A1 | 3/2007 | Kim et al. | |
| 2008/0145997 A1 * | 6/2008 | Tu | 438/398 |
| 2009/0075450 A1 | 3/2009 | Lee et al. | |
| 2009/0108402 A1 | 4/2009 | Bae et al. | |

FOREIGN PATENT DOCUMENTS

JP 2007-134435 5/2007
WO WO2005112082 A1 11/2005

* cited by examiner

*Primary Examiner* — Tuan N. Quach
(74) *Attorney, Agent, or Firm* — Howard M. Cohn; Katherine S. Brown

(57) ABSTRACT

A semiconductor capacitor and its method of fabrication are disclosed. A non-linear nitride layer is used to increase the surface area of a capacitor plate, resulting in increased capacitance without increase in chip area used for the capacitor.

5 Claims, 20 Drawing Sheets

SEMICONDUCTOR CAPACITOR

CROSS REFERENCE TO RELATED APPLICATIONS

This application is a continuation-in-part of U.S. patent application Ser. No. 12/837,121 filed Jul. 15, 2010, abandoned.

FIELD OF THE INVENTION

The present invention relates to semiconductor integrated circuits, and more particularly to a semiconductor capacitor, and method for fabricating the same.

BACKGROUND OF THE INVENTION

High Capacity Capacitors have been used in the semiconductor industry for years, in applications such as DRAM storage, protection from high energy environments, decoupling capacitors and many more.

As consumers are demanding products with more processing power, and smaller physical size, there is a need to improve the performance of various integrated circuits. Therefore, it is needed to have an improved semiconductor capacitor that has increased capacitance without a similar increase in substrate area required for its implementation.

SUMMARY OF INVENTION

In one embodiment of the present invention, a semiconductor capacitor is provided. The semiconductor capacitor comprises a first dielectric layer, a capacitor contact disposed within the first dielectric layer, a second dielectric layer disposed over the first dielectric layer, a cavity formed within the second dielectric layer, a metal plug disposed within the cavity, a nitride layer having a non-linear cross section, extending from the metal plug, a first metal layer disposed over the nitride layer, a third dielectric layer disposed over the first metal layer; and a second metal layer disposed over the third dielectric layer.

In another embodiment of the present invention, a method of fabricating a semiconductor capacitor is provided. The method comprises depositing a second dielectric layer on a first dielectric layer, forming a cavity in the second dielectric layer, depositing a nitride stack comprising a slow-etch nitride layer disposed between two fast-etch nitride layers in the cavity and also depositing said nitride stack on the second dielectric layer, etching a portion of the nitride stack within the cavity, thereby exposing the first dielectric layer, planarizing the nitride stack, thereby removing the nitride stack from the top surface of the second dielectric layer, depositing a metal plug in the cavity, removing the fast-etch nitride layers of the nitride stack while preserving the slow-etch nitride layer of the nitride stack, depositing a first metal layer over the slow-etch nitride layer, depositing a third dielectric layer over the first metal layer; and depositing a second metal layer over the third dielectric layer.

In another embodiment of the present invention, a method of fabricating a semiconductor capacitor, is provided. This method comprises depositing a second dielectric layer on a first dielectric layer, forming a cavity in the second dielectric layer, depositing a nitride stack comprising a slow-etch nitride layer disposed between two layers of fast-etch nitride in the cavity, and also depositing the nitride stack on the second dielectric layer, etching a portion of the nitride stack within the cavity, thereby exposing the first dielectric layer, planarizing the nitride stack, thereby removing the nitride stack from the top surface of the second dielectric layer, depositing a metal plug in the cavity, removing the fast-etch nitride layers of the nitride stack while preserving the slow-etch nitride layer of the nitride stack, depositing a first metal layer over the slow-etch nitride layer and the second dielectric layer, depositing a stabilization layer over the slow-etch nitride lay planarizing the stabilization layer and the first metal layer, thereby removing the first metal layer from the second dielectric layer, removing the stabilization layer, depositing a third dielectric layer over the first metal layer, and depositing a second metal layer over the third dielectric layer.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Block diagrams may not illustrate certain connections that are not critical to the implementation or operation of the present invention, for illustrative clarity.

Figure 1:
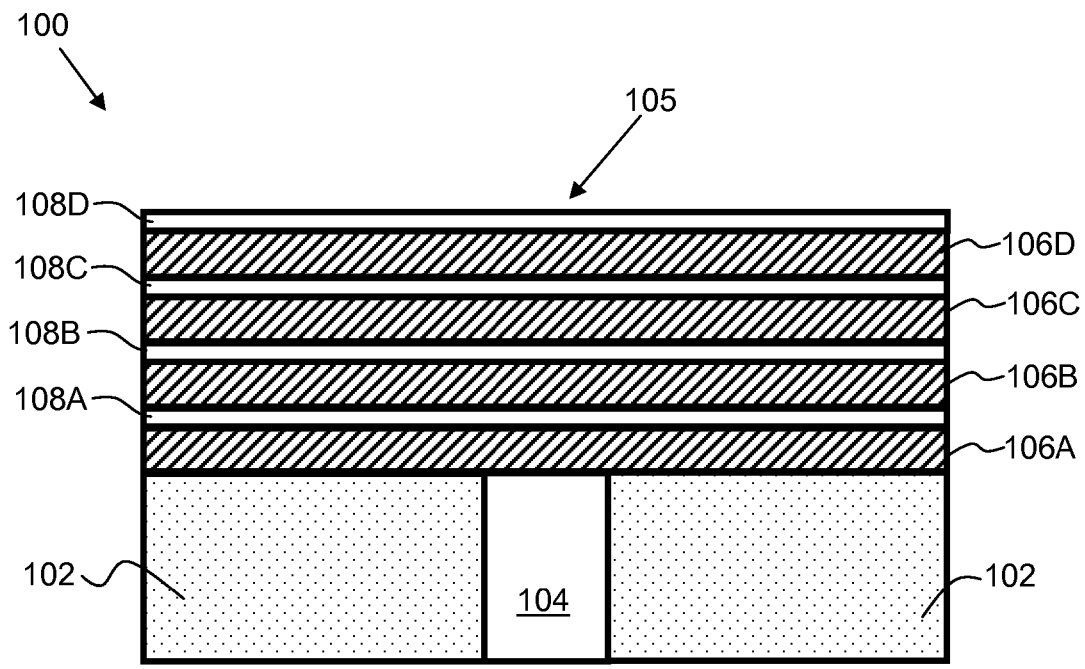

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit(s) being the number of the drawing figure (FIG).

FIGS. 1-10 show a capacitor in accordance with an embodiment of the present invention at various steps in the fabrication process.

FIGS. 11A, 11B, 12 and 13 show a capacitor in accordance with an alternate embodiment of the present invention at various steps in the fabrication process.

Figure 14:
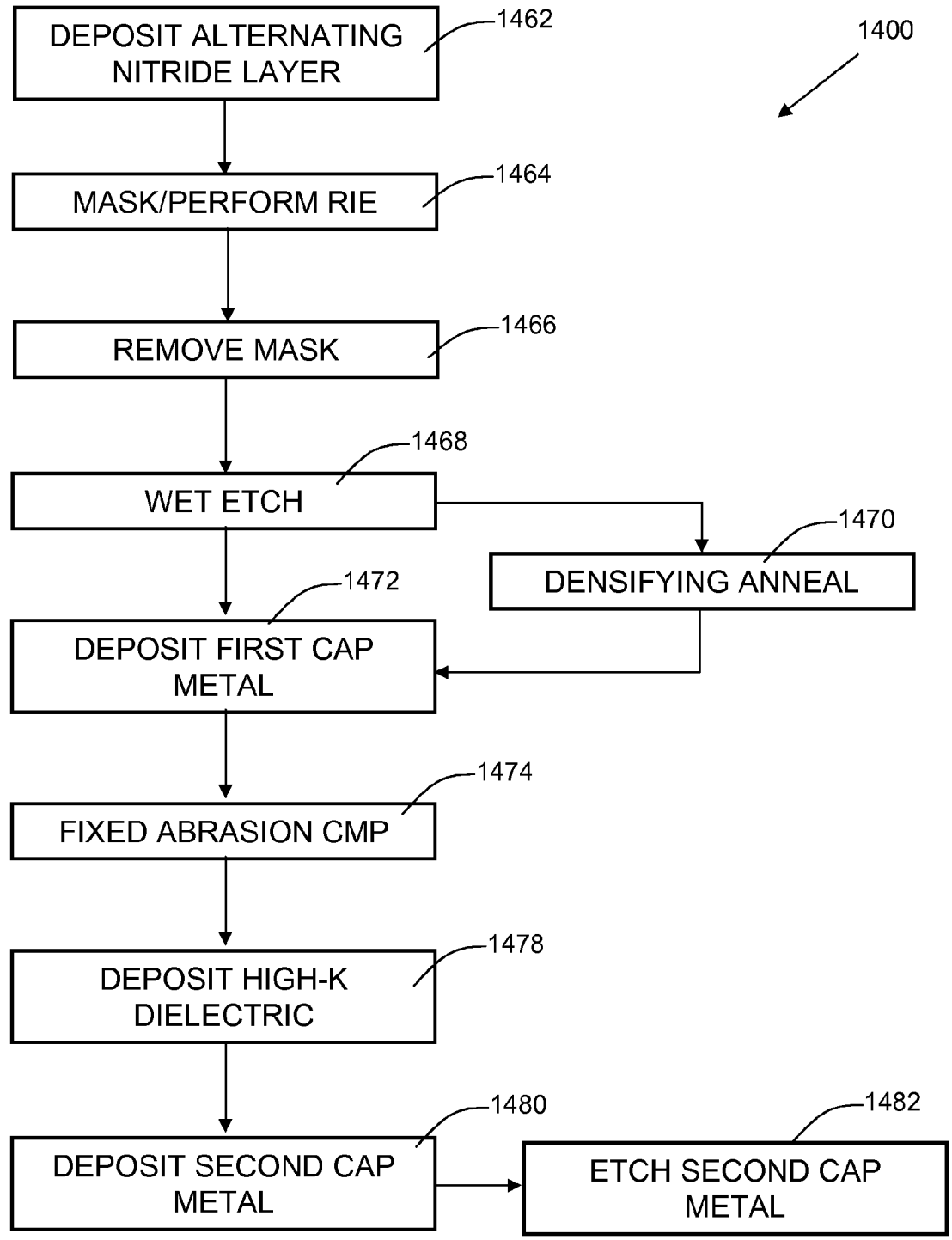
Figure 15:
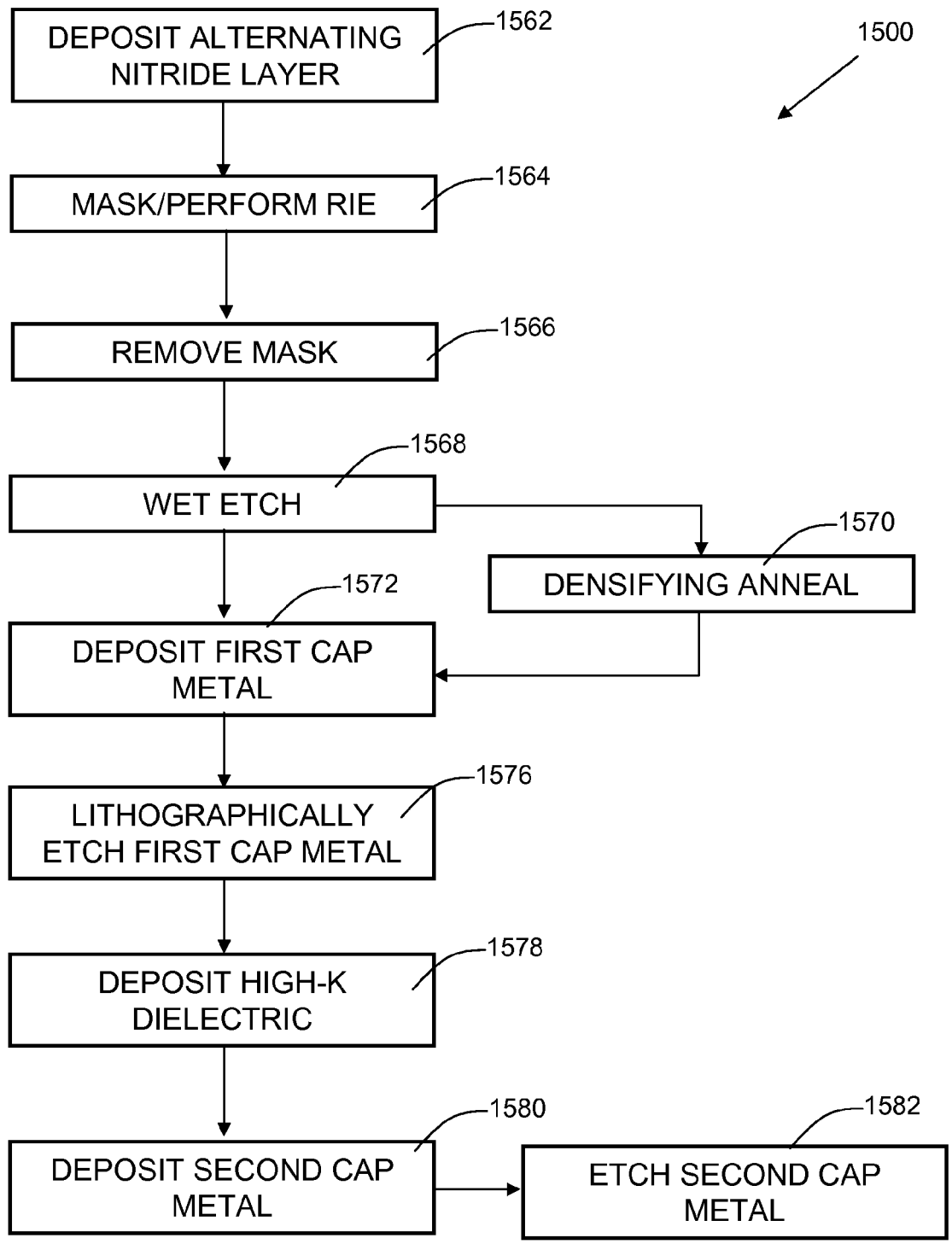

FIGS. 14 and 15 are flowcharts indicating process steps for methods in accordance with embodiments of the present invention.

Figure 16:
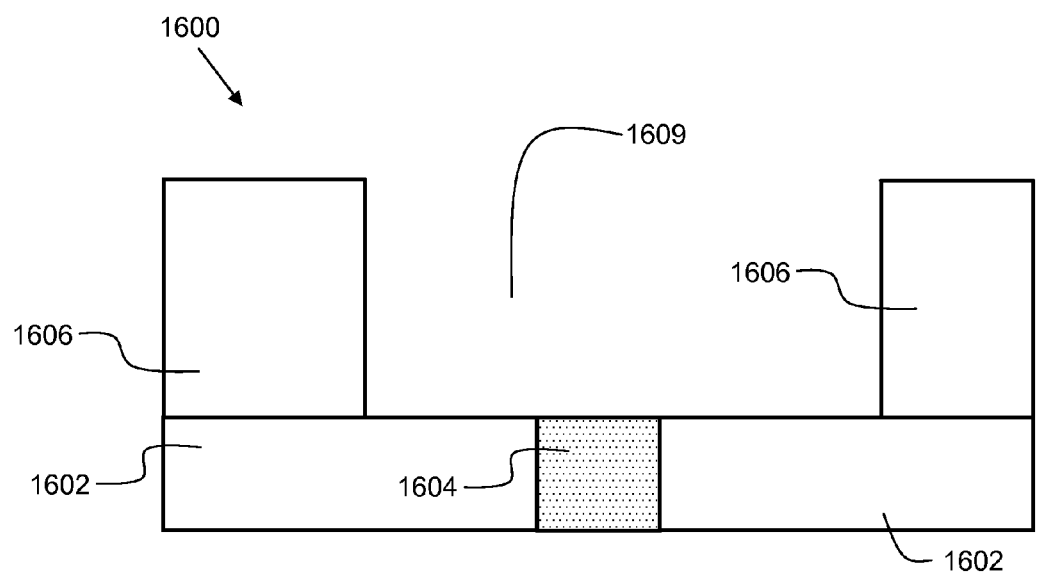

FIG. 16 shows a prior art semiconductor structure as a starting point for an additional embodiment of the present invention.

Figure 17:
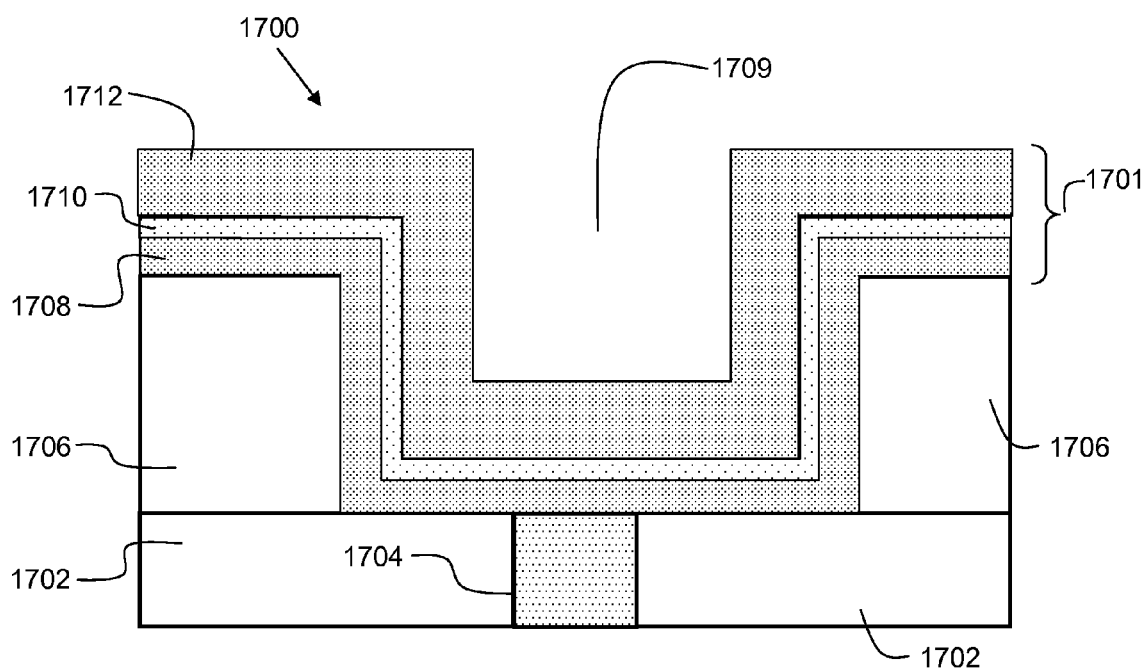

FIG. 17 shows a semiconductor structure after a subsequent process step of depositing a nitride layer stack.

Figure 17B:
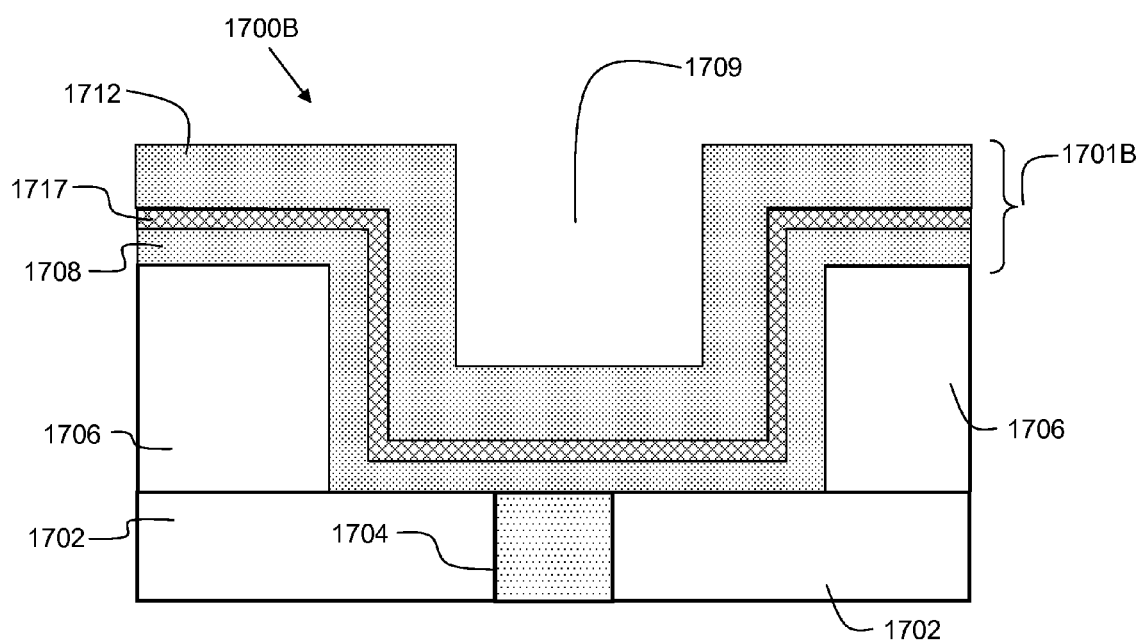

FIG. 17B shows a semiconductor structure after a subsequent process step of depositing a nitride layer stack in accordance with an alternative embodiment of the present invention.

Figure 18:
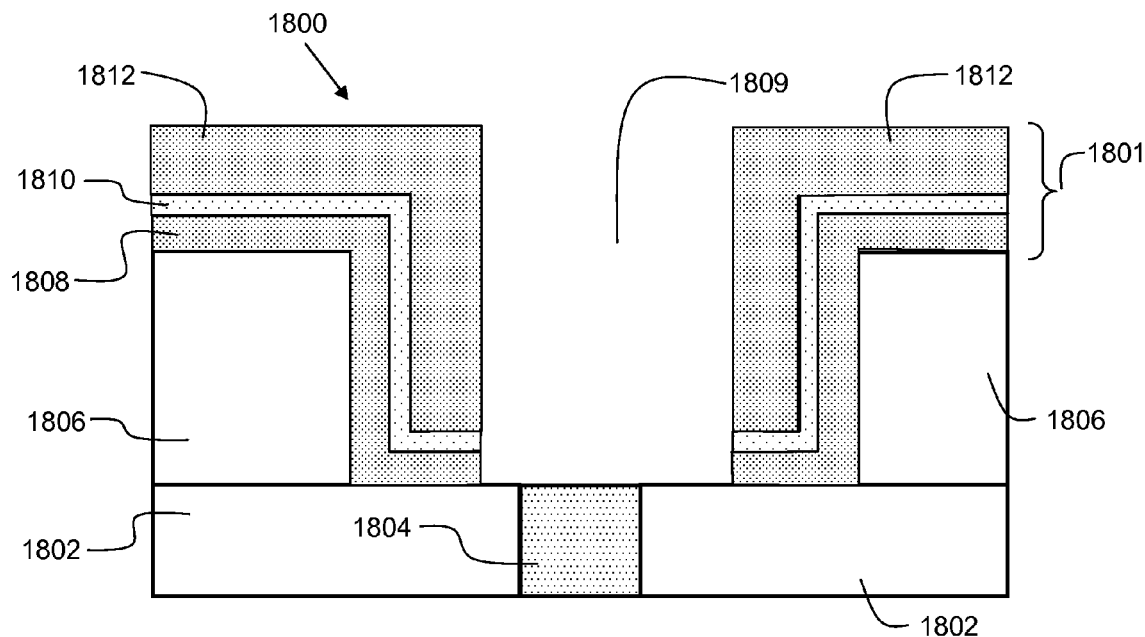

FIG. 18 shows a semiconductor structure after a subsequent process step of etching the base of the nitride layer stack.

Figure 19:
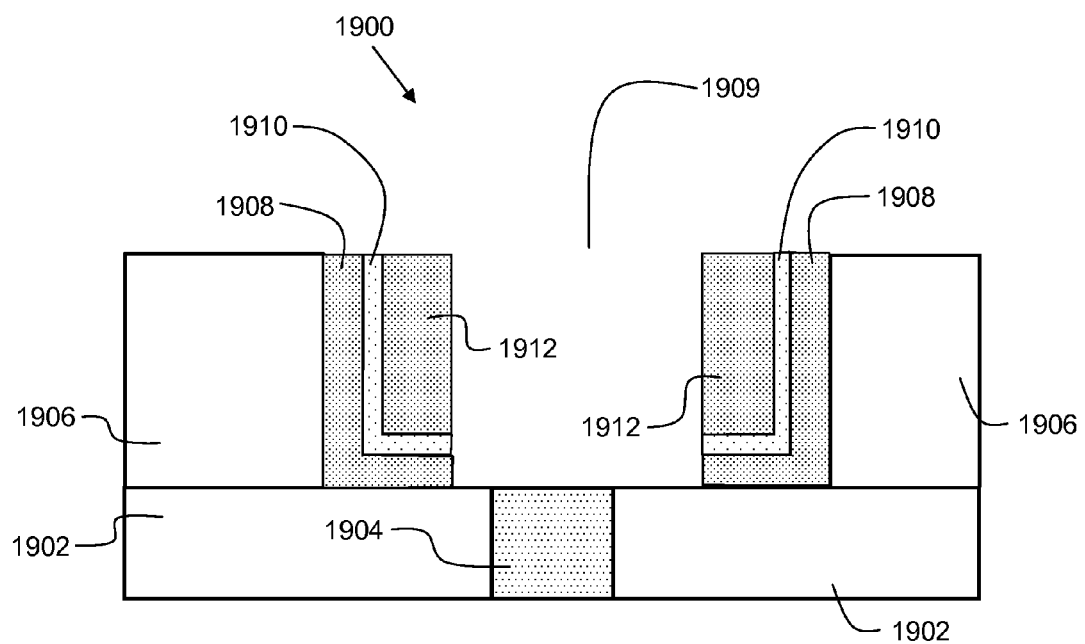

FIG. 19 shows a semiconductor structure after a subsequent process step of planarizing the semiconductor structure.

Figure 20:
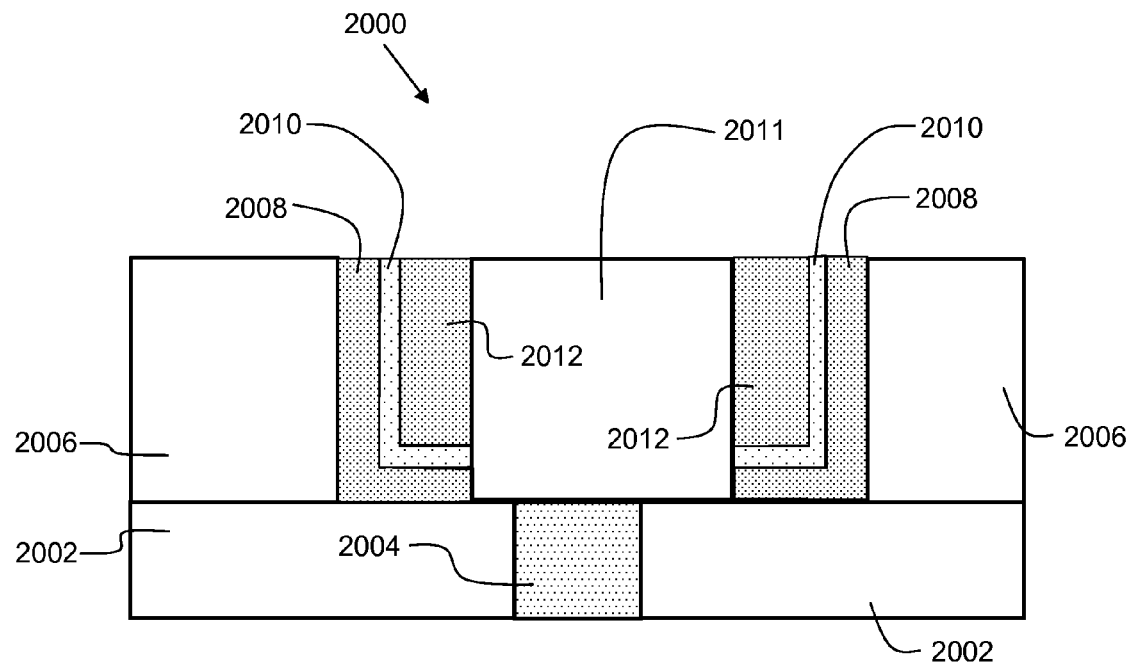

FIG. 20 shows a semiconductor structure after a subsequent process step of depositing a metal plug into the semiconductor structure.

Figure 21:
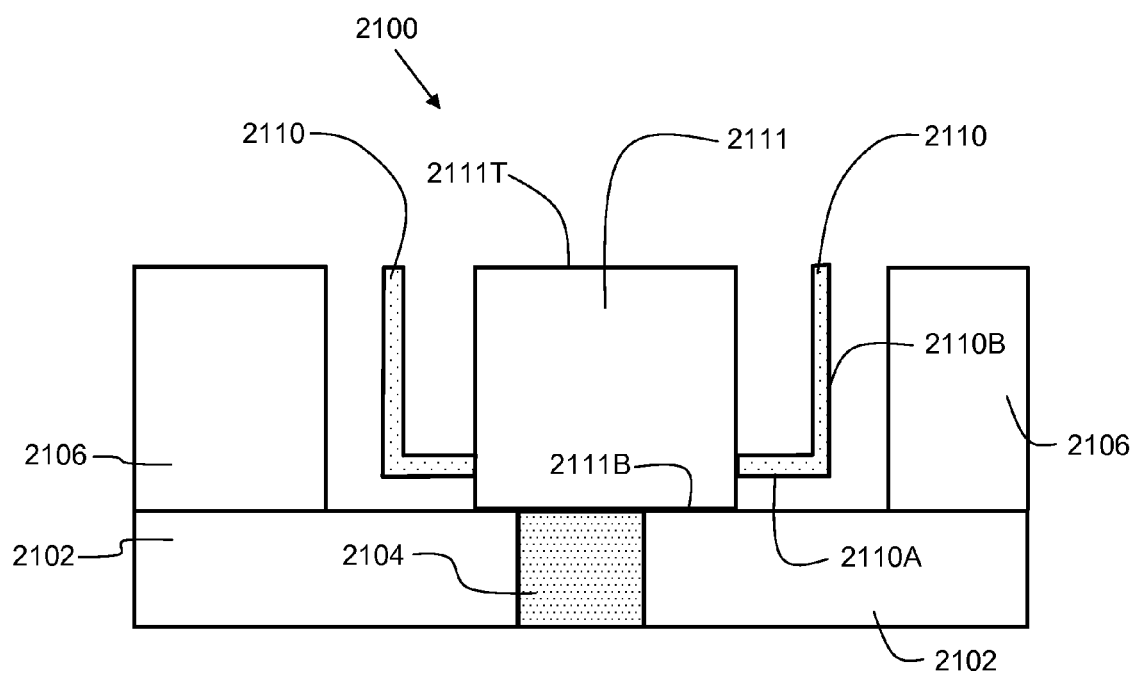

FIG. 21 shows a semiconductor structure after a subsequent process step of removing a portion of the nitride layer stack.

Figure 22:
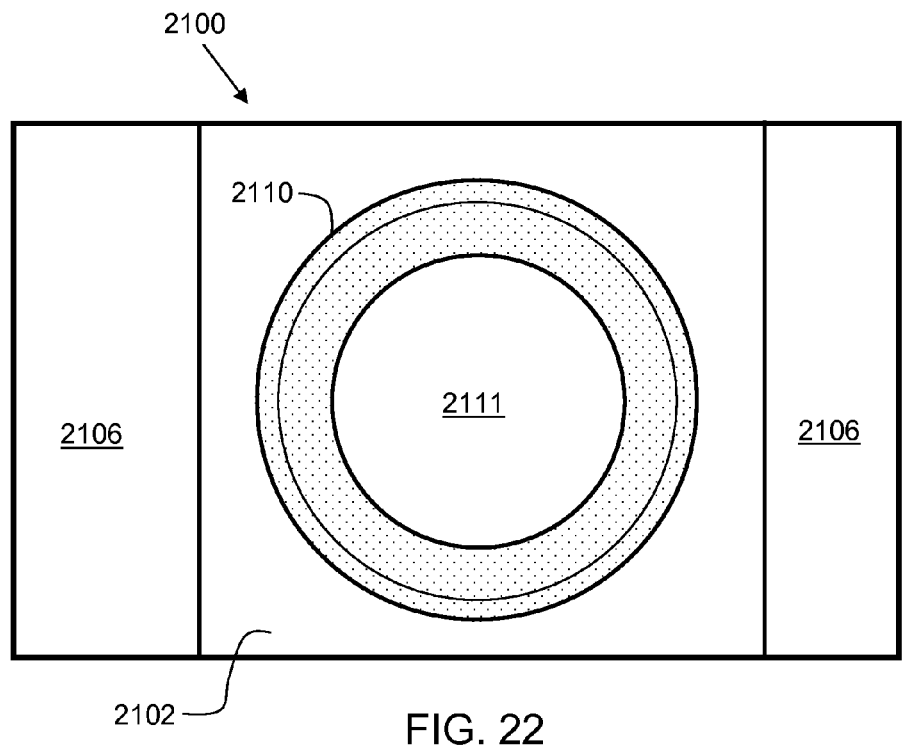

FIG. 22 shows a top-down view of the semiconductor structure of FIG. 21.

Figure 23:
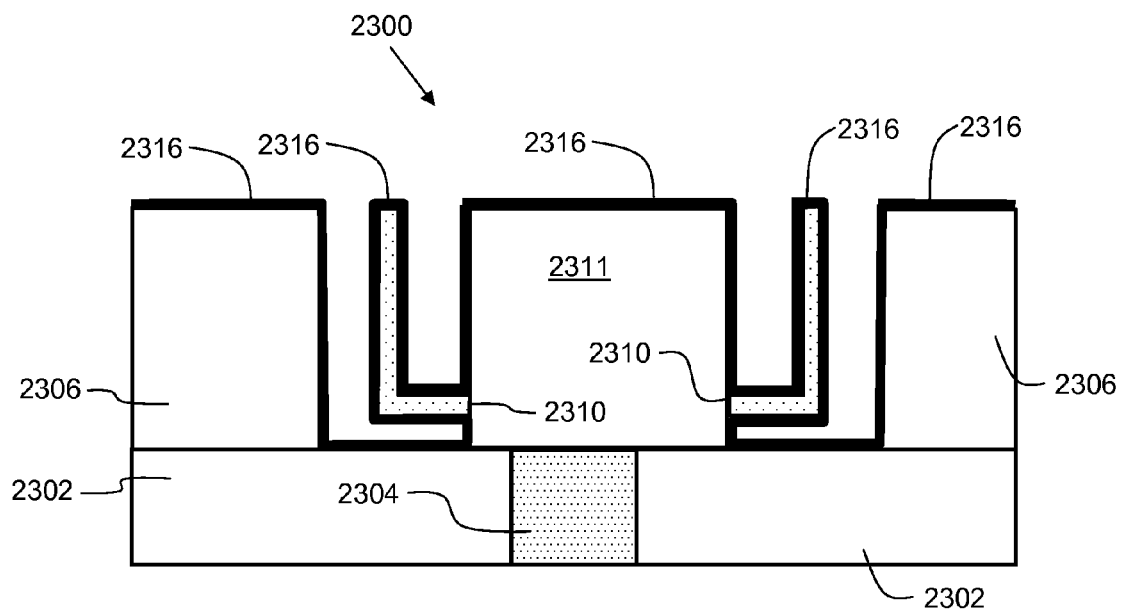

FIG. 23 shows a semiconductor structure after a subsequent process step of depositing a first metal layer over the semiconductor structure.

Figure 24:
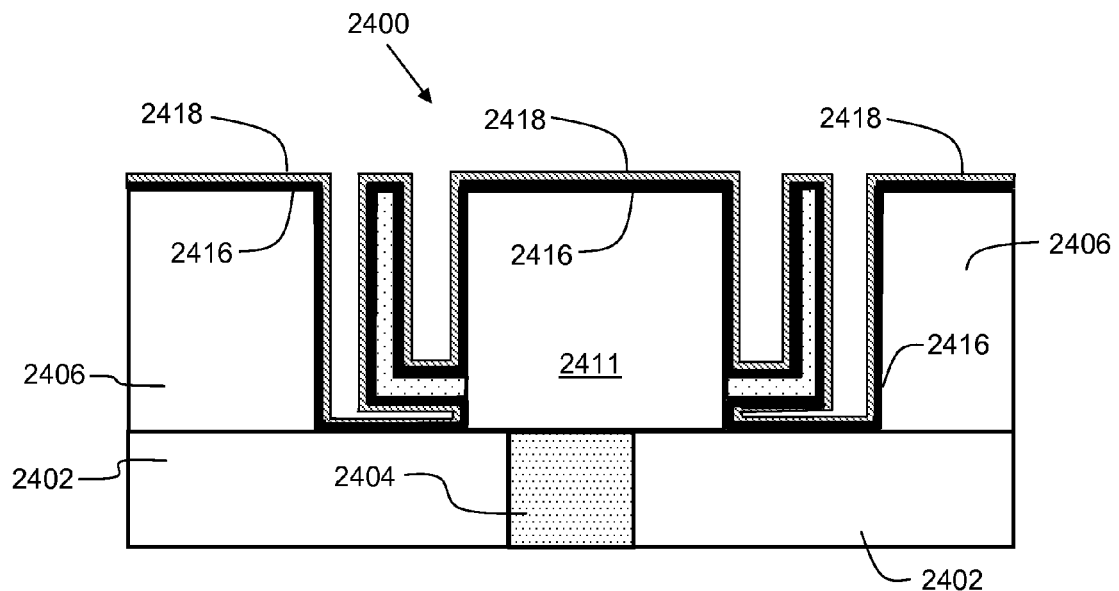

FIG. 24 shows a semiconductor structure after a subsequent process step of depositing a dielectric layer over the semiconductor structure.

Figure 25:
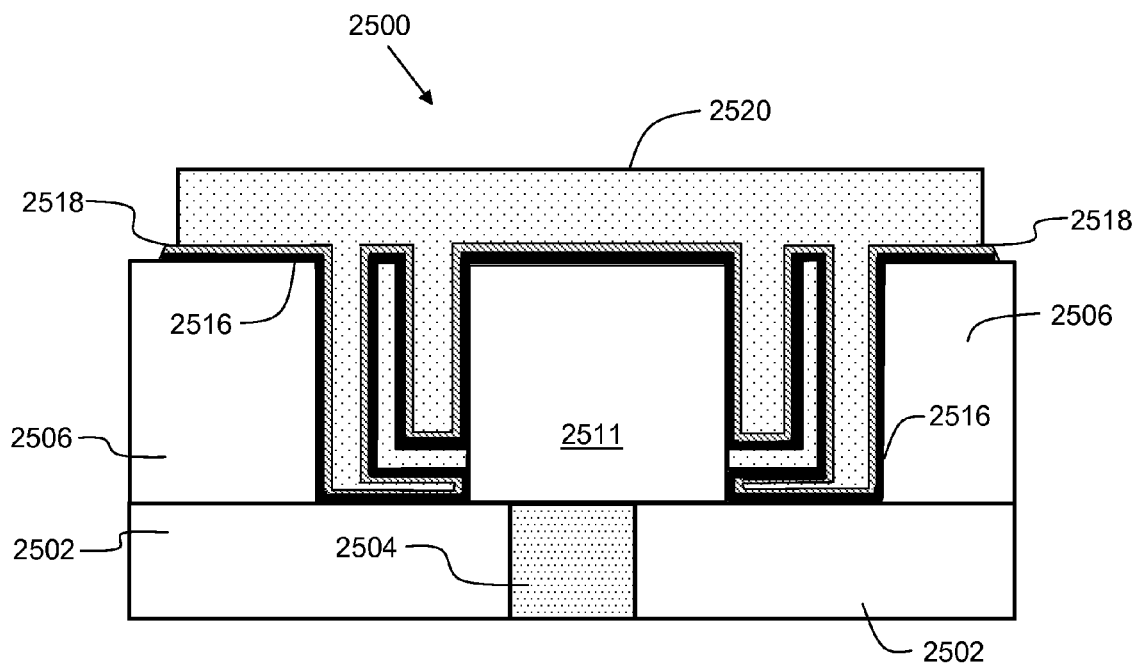

FIG. 25 shows a semiconductor structure after a subsequent process step of depositing a second metal layer over the semiconductor structure.

Figure 26:
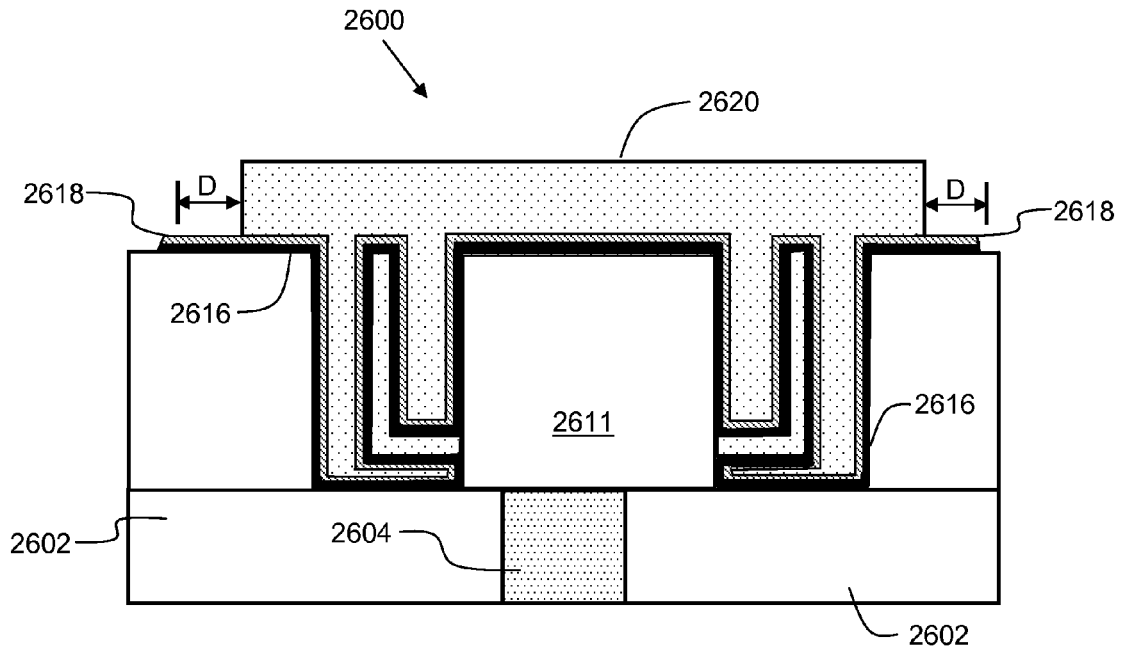

FIG. 26 shows a semiconductor structure after an optional subsequent process step of performing an isotropic etch of the second metal layer.

Figure 27:
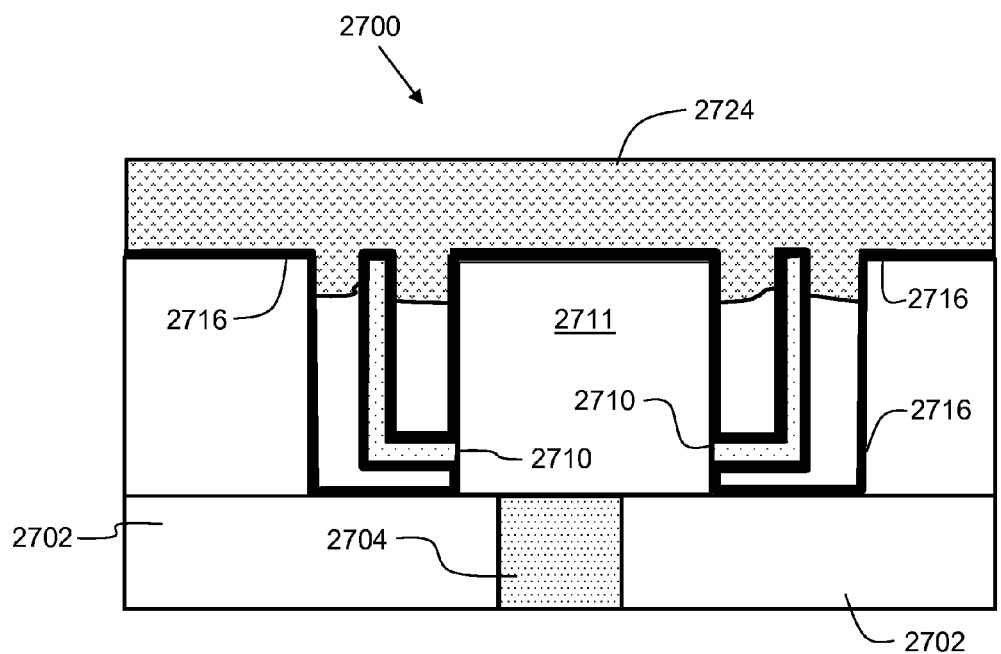

FIG. 27 shows a semiconductor structure after a subsequent process step from FIG. 23 of depositing a nitride stabilization layer for an alternative method of fabrication.

Figure 27B:
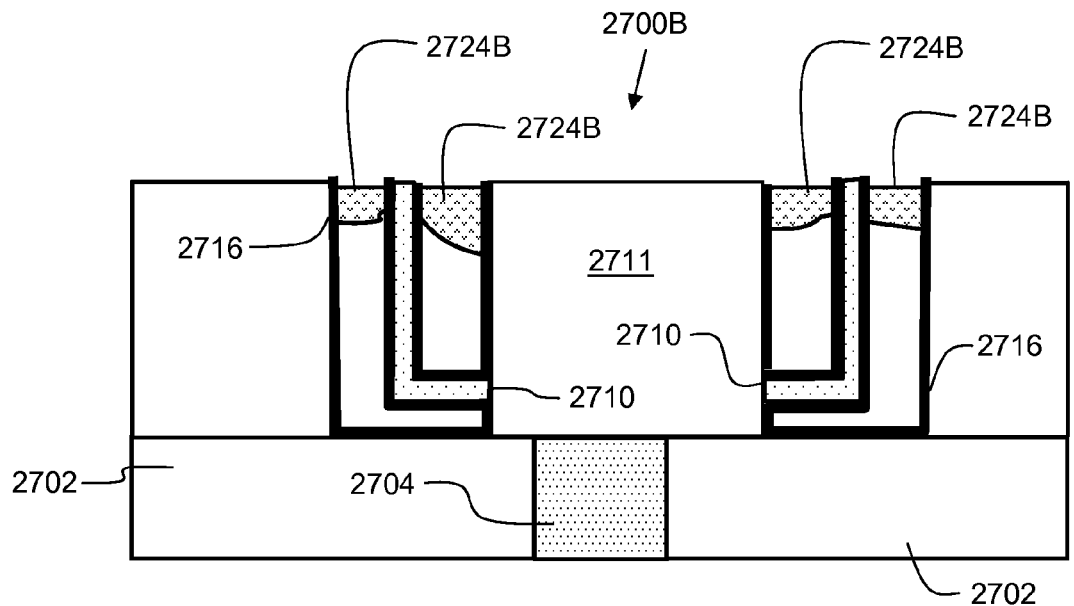

FIG. 27B shows a semiconductor structure after a subsequent process step from FIG. 27 of planarizing the nitride stabilization layer.

Figure 28:
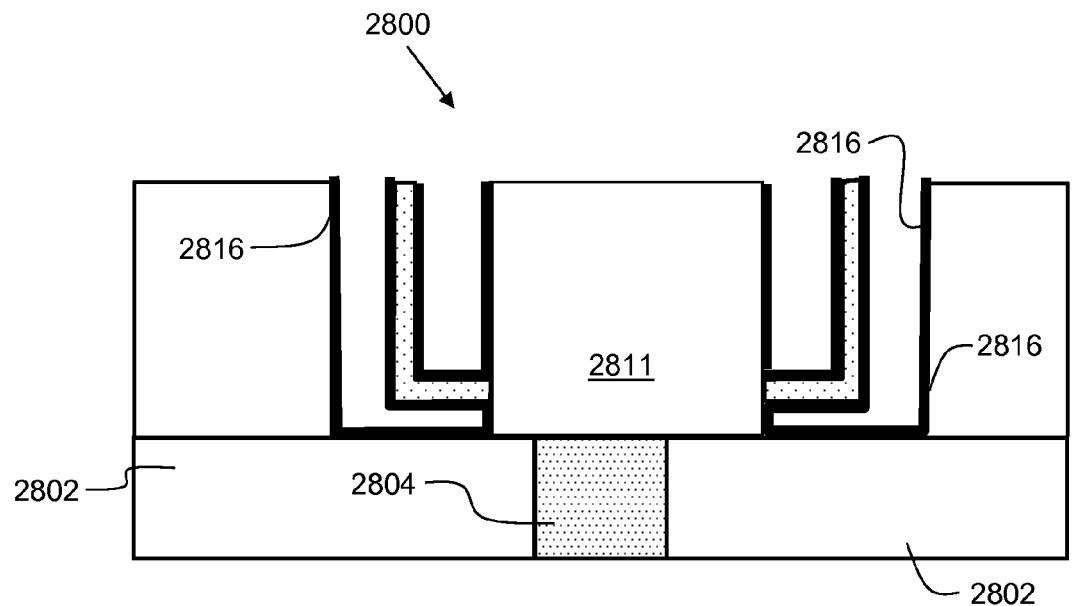

FIG. 28 shows a semiconductor structure after a subsequent process step from FIG. 27 of removing the nitride stabilization layer and first metal layer from the top surfaces of the semiconductor structure.

Figure 29:
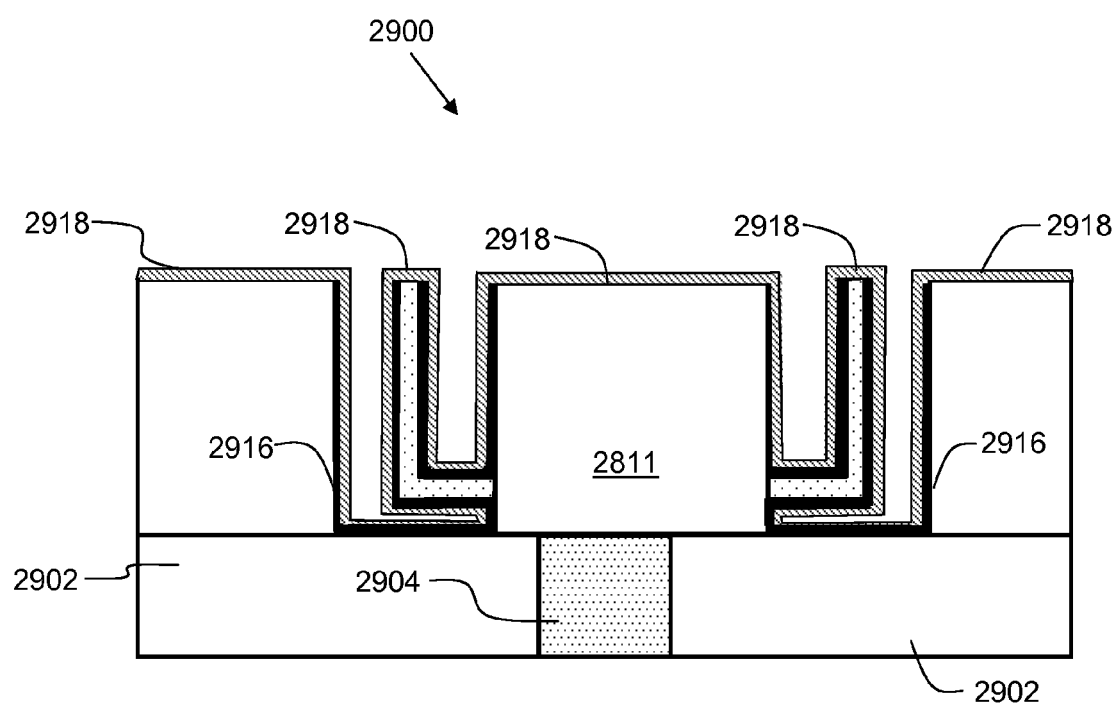

FIG. 29 shows a semiconductor structure after a subsequent process step from FIG. 28, of depositing a dielectric layer over the semiconductor structure.

Figure 30:
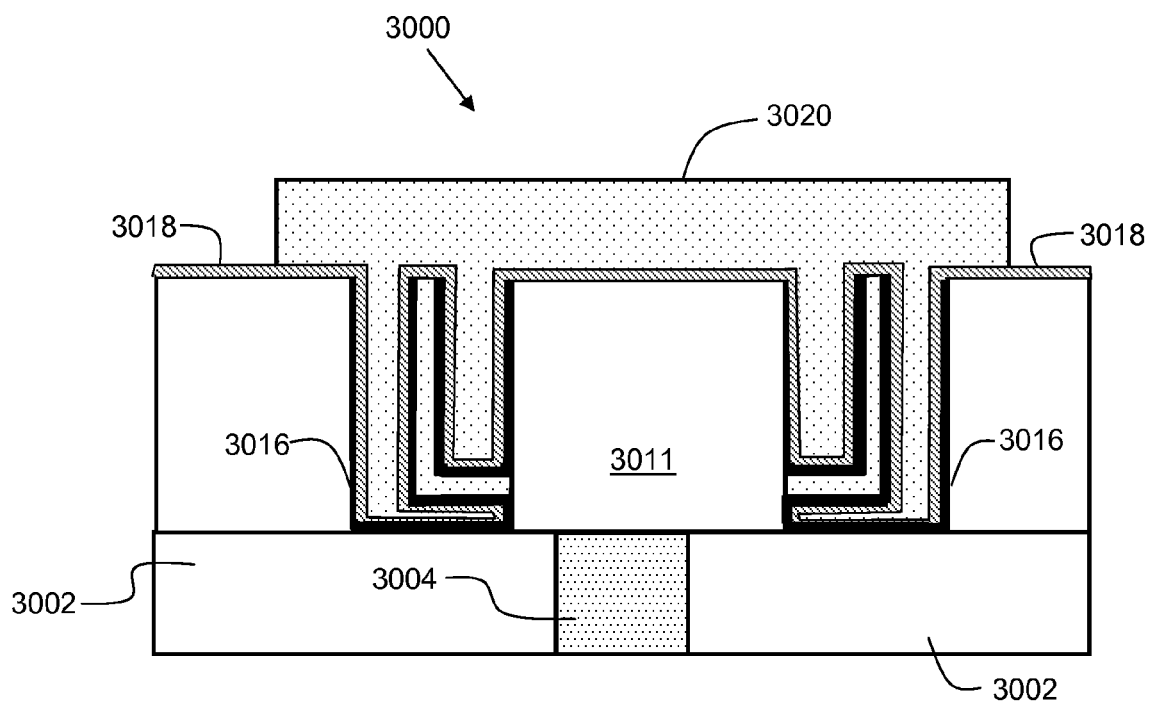

FIG. 30 shows a semiconductor structure after a subsequent process step from FIG. 29, of depositing a second metal layer over the semiconductor structure.

Figure 31:
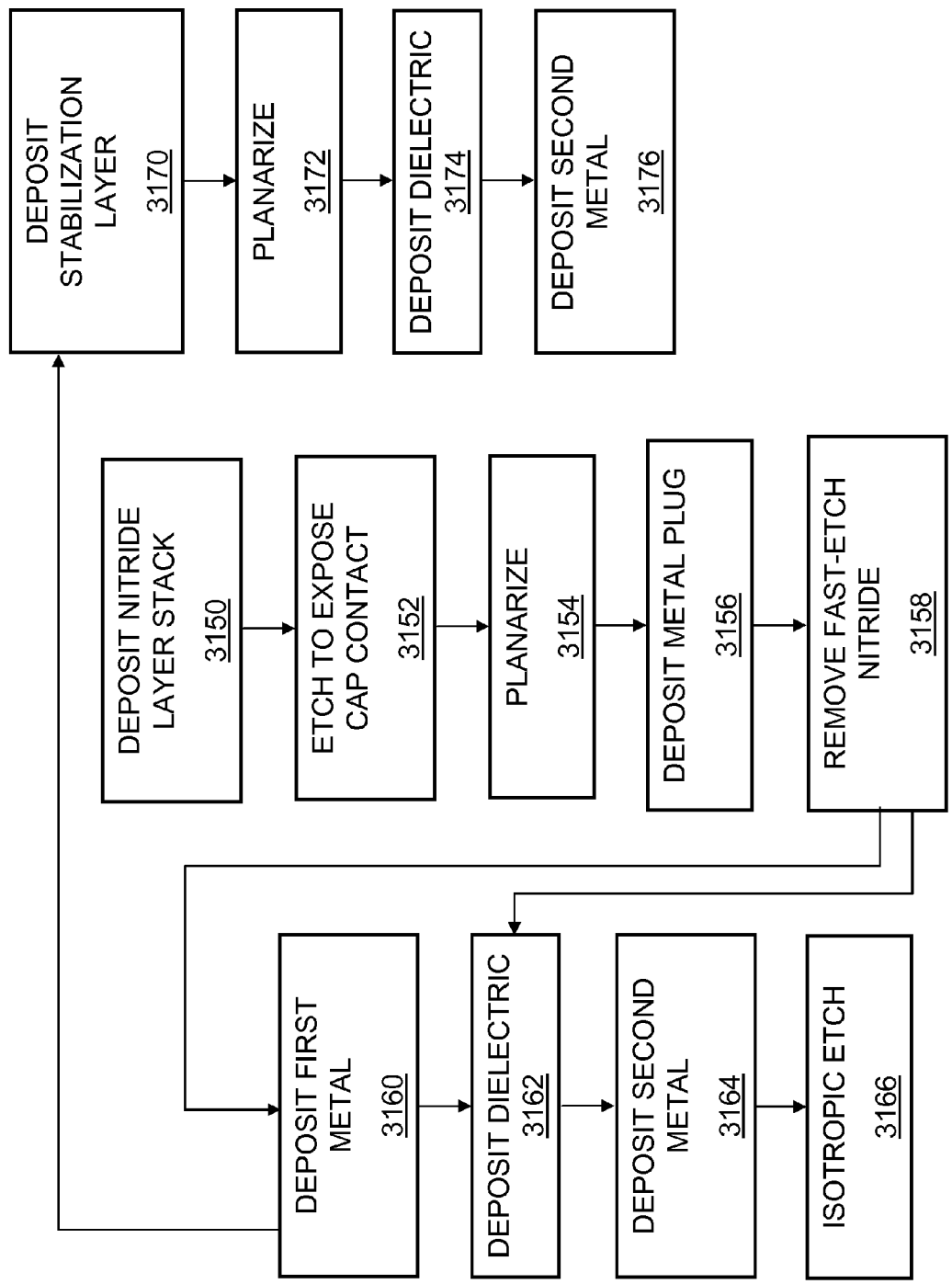

FIG. 31 is a flowchart showing process steps for fabricating a capacitor in accordance with embodiments of the present invention.

Figure 32:
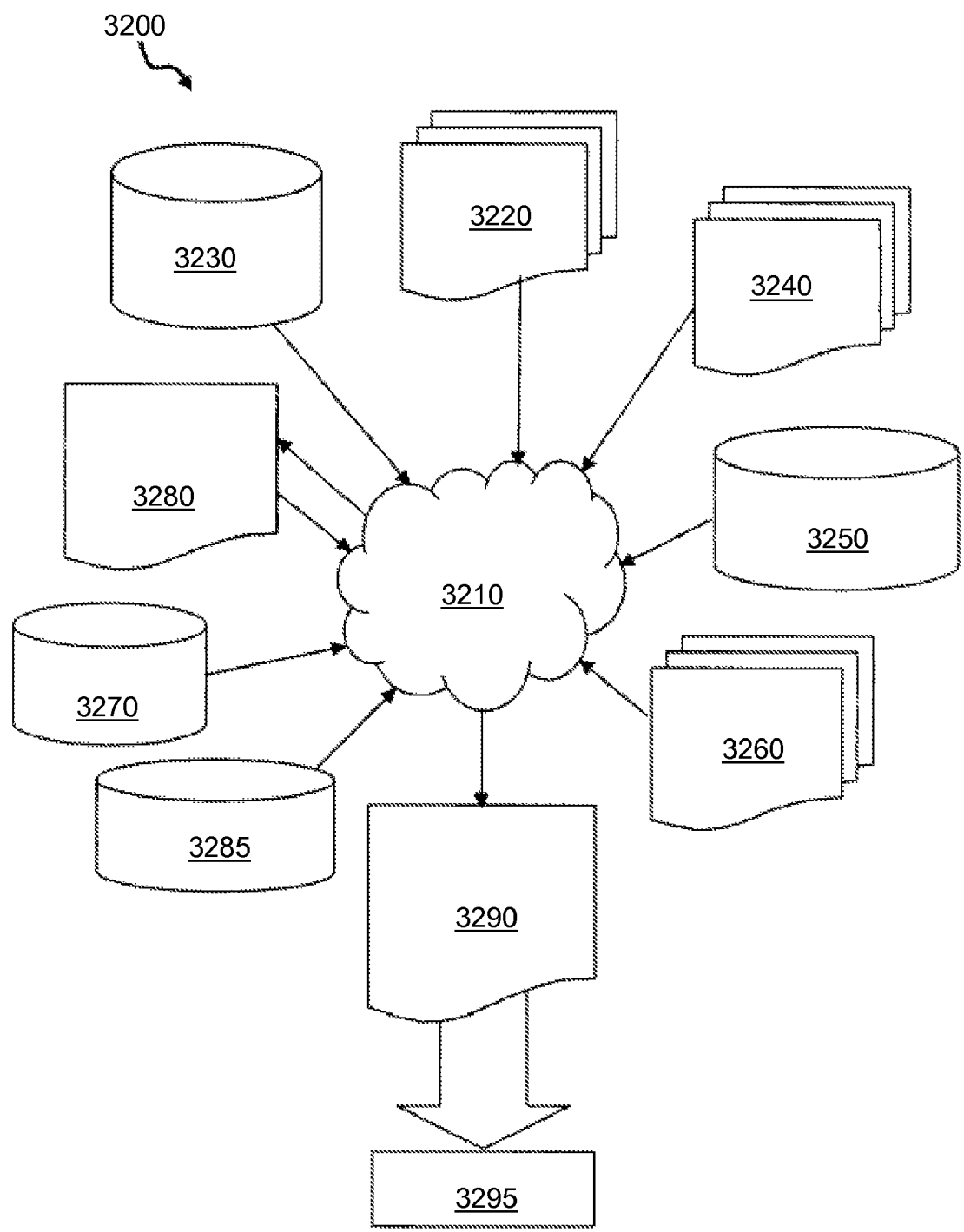

FIG. 32 shows a block diagram of an exemplary design flow.

DETAILED DESCRIPTION

FIG. 1 shows a semiconductor structure 100 at an intermediate processing step. Base Dielectric layer 102 is typically an interlayer dielectric layer (ILD). Within dielectric layer 102 is metal contact 104, which forms a first contact for a capacitor. In one embodiment, metal contact 104 is comprised of tungsten. In another embodiment, metal contact 104 is comprised of doped polysilicon. Disposed on base dielectric layer 102 is a nitride stack 105 which is comprised of a plurality of alternating fast-etch (106A-106D) and slow-etch (108A-108D) nitride sublayers. Each layer with a 106 reference number is a fast-etch nitride sublayer. Each layer with a 108 reference number is a slow-etch nitride sublayer.

The fast and slow etch nitrides may be referred to by the generic reference number (without an accompanying letter) when referred to in a general sense. A letter suffix will be used when discussing a specific nitride sublayer. Nitride layer 106A is deposited onto base dielectric layer 102. Nitride layer 108A is disposed onto nitride layer 106A. This structure can be repeated a number of times to form the nitride stack 105. The nitride stack 105 in the embodiment shown in FIG. 1 has four layers of fast-etch nitride interspersed with four layers of slow-etch nitride. However, embodiments of the present invention may use more or less layers of fast and slow etch nitride layers. The alternating nitride layers are deposited in a single deposition step where the hydrogen content is varied by changing deposition conditions inside of the deposition reactor. The differing hydrogen content causes the nitride layers to etch at different rates when undergoing a wet etch.

Slow-etch nitride 108 is a typical nitride such as silicon nitride ($Si_3N_4$) having a low hydrogen content. Fast-etch nitride 106 is also $Si_3N_4$, but contains higher levels of hydrogen than slow-etch nitride 108. The increased hydrogen content in the fast-etch nitride 106 results in a much faster etch rate when subjected to a wet etch using an etchant comprised of HF. This will be used to create a capacitor with increased surface area, hence increased capacitance.

The increased hydrogen content in the fast-etch nitride comes from inclusion of a higher percentage of NH bonds. The percentage of NH bonds varies inversely with film density. Thus, the slow-etch nitride has a higher density than the fast-etch nitride. In one embodiment, the density of the slow-etch nitride ranges from about 2.6 g/cc to about 2.8 g/cc (grams/cubic centimeter), and in a particular embodiment, the density is about 2.62 g/cc, and the fast-etch nitride has a density ranging from about 2.0 g/cc to about 2.4 g/cc. Other embodiments have a fast-etch nitride with a density lower than 2.0 g/cc.

The alternating layers of fast-etch and slow-etch nitrides can be formed by alternating deposition conditions in real time using well-known processes such as CVD or PECVD. In one embodiment, in order to form the fast-etch nitride film, the deposition conditions are modified by increasing the flow ratio of $NH_3$ to $SiH_4$ flow to ratio of less than 0.25, and decreasing the power during the deposition to less than 40% of the power that is used for the slow-etch nitride film. U.S. Pat. No. 4,960,656, included herein by reference, discloses a method of altering hydrogen content in a nitride layer.

Figure 2:
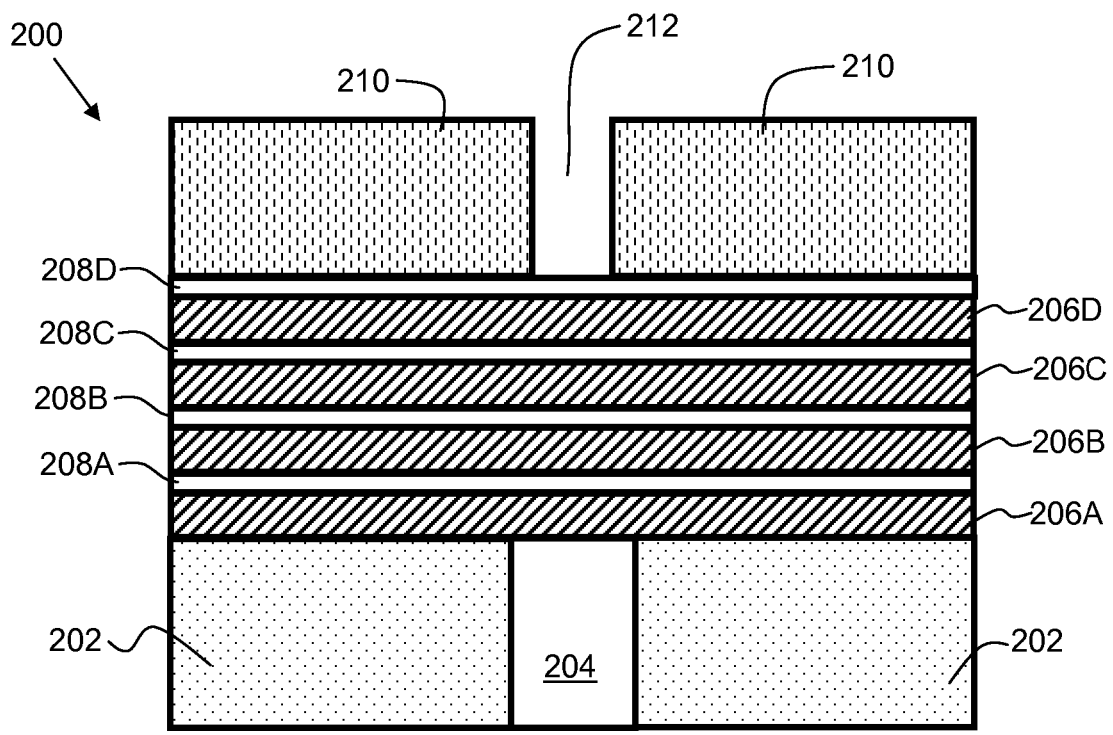

FIG. 2 shows a semiconductor structure 200 at a subsequent intermediate processing step. As stated previously in this disclosure, similar elements may be referred to by similar numbers in various figures (FIGs) of the drawing, in which case typically the last two significant digits may be the same. For example, base dielectric layer 102 of FIG. 1 is similar to base dielectric layer 202 of FIG. 2. In this process step, masking layer of photoresist (a.k.a mask) 210 is deposited on the top nitride layer 208D. Using industry-known lithographic methods, a void 212 is formed above the nitride layer 208D where a cavity or trench will be formed.

Figure 3:
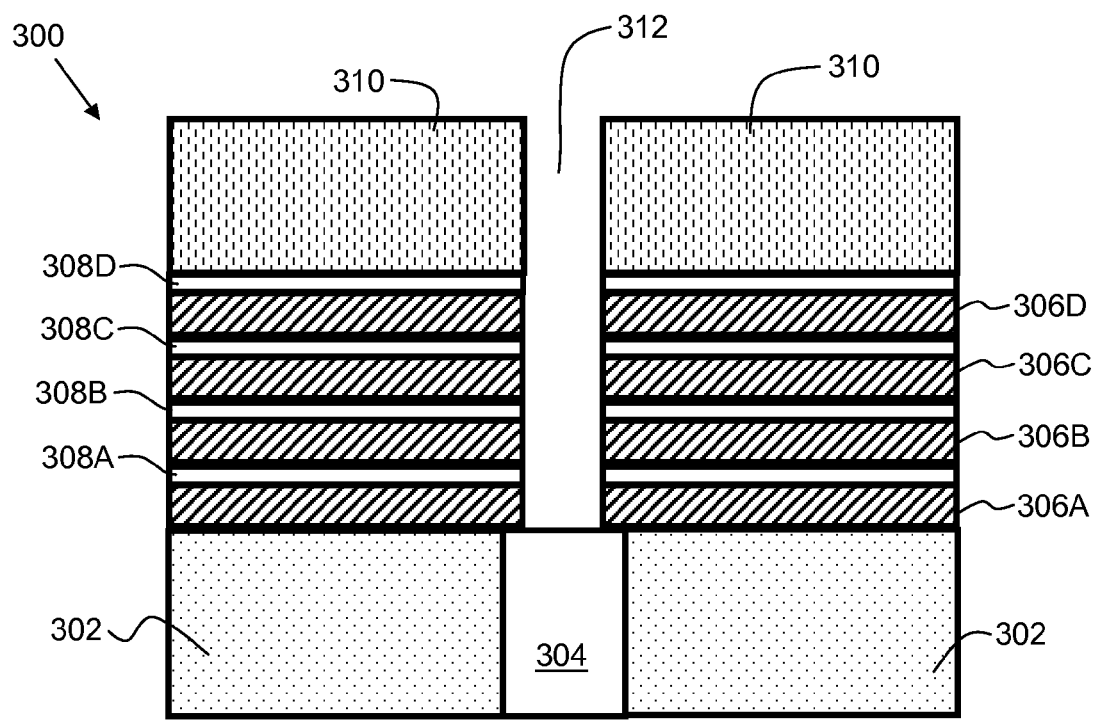

FIG. 3 shows a semiconductor structure 300 at a subsequent intermediate processing step. In this processing step, a reactive ion etch (RIE) is applied to create void 312, which extends from the top of semiconductor structure 300 to first metal contact 304. Note that perfect alignment is not required as long as part of the opening lands on the contact.

Figure 4:
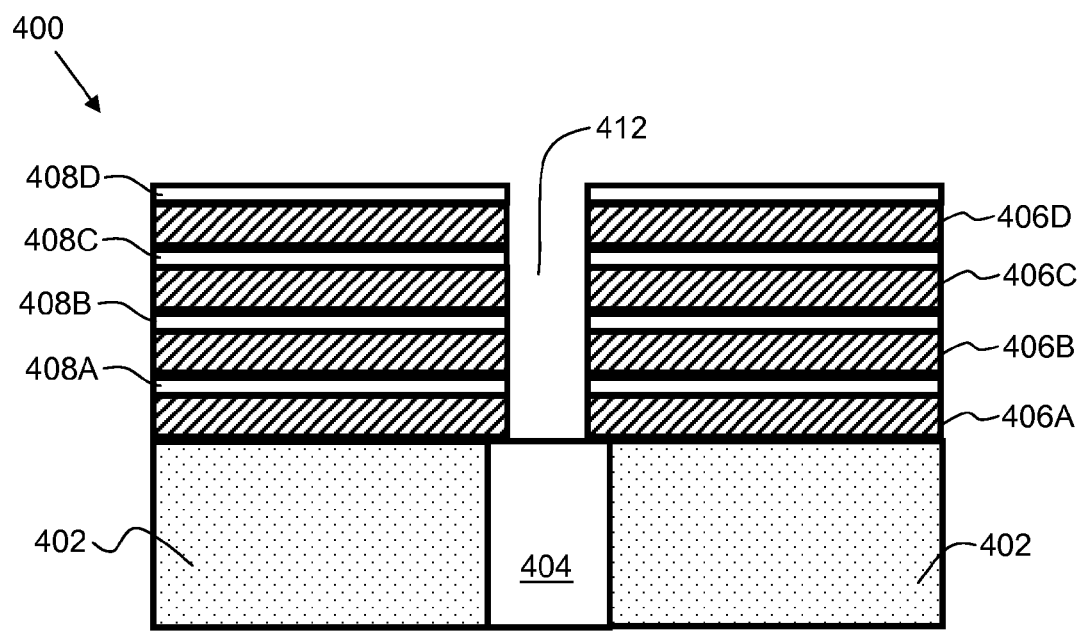

FIG. 4 shows a semiconductor structure 400 at a subsequent intermediate processing step. In this processing step, the mask layer is removed, typically via a resist strip process, well known in the industry.

Figure 5:
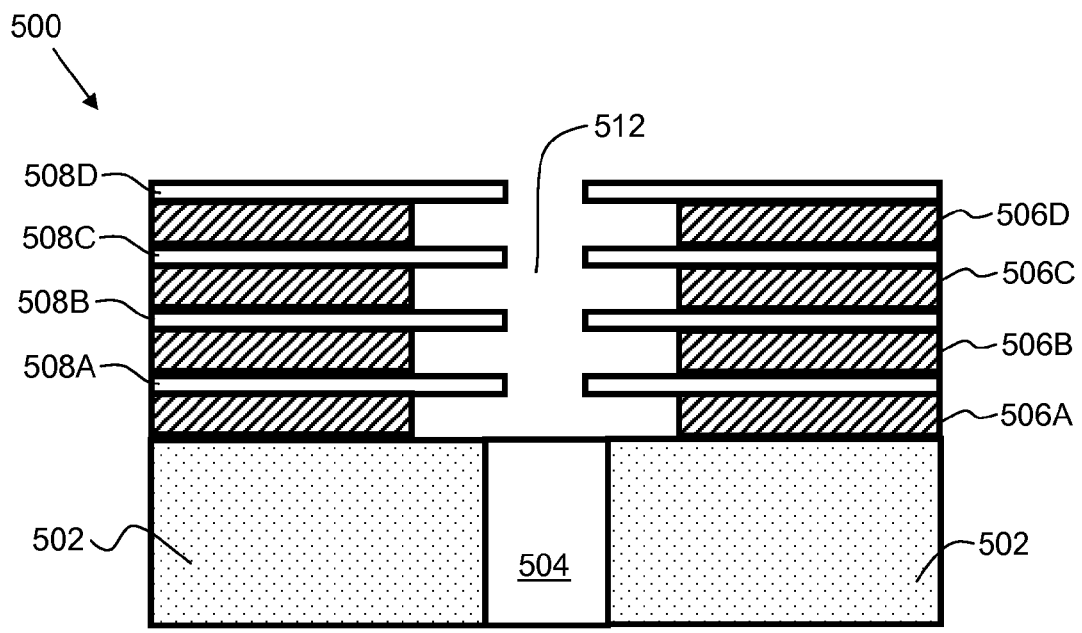

FIG. 5 shows a semiconductor structure 500 at a subsequent intermediate processing step. In this processing step, a wet etch using HF (hydrofluoric acid) is applied to semiconductor structure 500. Because of the different properties of the fast-etch nitride 506 and the slow-etch nitride 508, more of the slow-etch nitride 508 remains, forming a corrugated shape within trench 512. Namely the increased hydrogen content in the fast-etch nitride 506 provides an etch rate of as much as 100 times that of slow-etch nitride 508. In one embodiment, the etch rate difference of the fast-etch nitride is 100 to 200 times the rate of the slow-etch nitride.

In the embodiment shown in FIG. 5, fast-etch nitride 506 is thicker than slow-etch nitride 508. This provides the advantage of further increasing surface area within trench 512, as the fast-etch nitride, being thicker, exposes more surface area when etched. In one embodiment, fast-etch nitride 506 is 2 to 3 times thicker than slow-etch nitride 508. In one embodiment, slow-etch nitride 508 ranges in thickness from 70 angstroms to 140 angstroms, and fast-etch nitride 506 ranges in thickness from 190 angstroms to 260 angstroms.

Optionally, after the wet etch, a densifying anneal may be performed. In one embodiment, this step is performed at a temperature in the range of about 900 to about 1050 degrees Centigrade, for a duration ranging from Spike (about 1 second) to about 60 seconds. In another embodiment, well-suited for BEOL applications, the temperature is limited to 400 degrees Centigrade and the duration is less than 1 hour. The densifying anneal serves the purpose of driving out the excess hydrogen thereby decreasing the sensitivity of the stack during other steps in the fabrication process, such as HF pre-clean processes.

Figure 6:
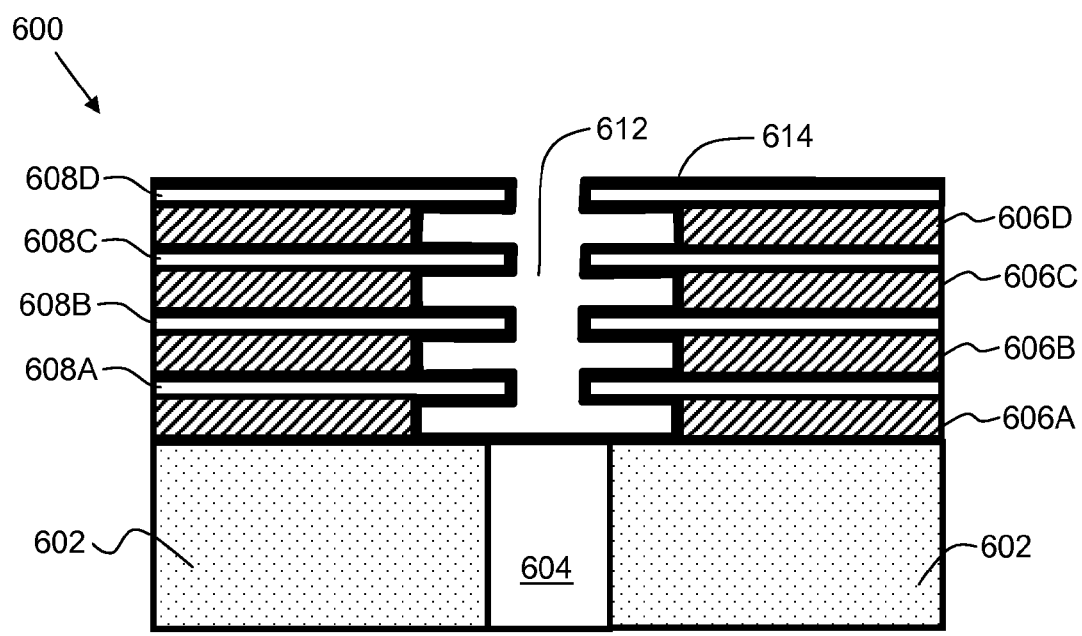

FIG. 6 shows a semiconductor structure 600 at a subsequent intermediate processing step. In this processing step, a first metal layer 614 is applied to the interior surface of trench 612. In one embodiment, the first metal layer 614 may be one of ruthenium or tantalum. Metal layer 614 is preferably applied via atomic layer deposition (ALD). ALD deposits layers with good conformal properties, even with the high aspect ratios within trench 612, and allows metal layer 614 to be uniformly applied to the interior surface of trench 612.

Figure 7:
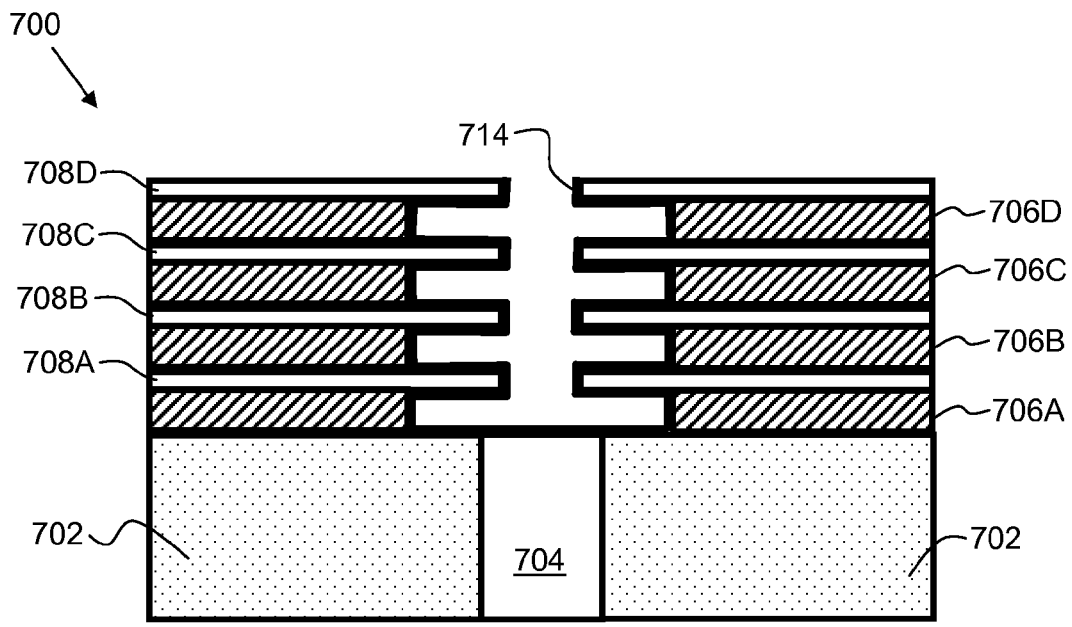

FIG. 7 shows a semiconductor structure 700 at a subsequent intermediate processing step. In this processing step, the portion of metal layer 614 that was on nitride layer 608D (see FIG. 6) is removed. In one embodiment, the removal of that portion of metal layer is performed via chemical mechanical polish (CMP). In particular, a fixed abrasive CMP process, which does not use any slurry, is well suited for this step. The use of slurry is preferably avoided since slurry could potentially clog the trench 714, causing fabrication defects.

Figure 8:
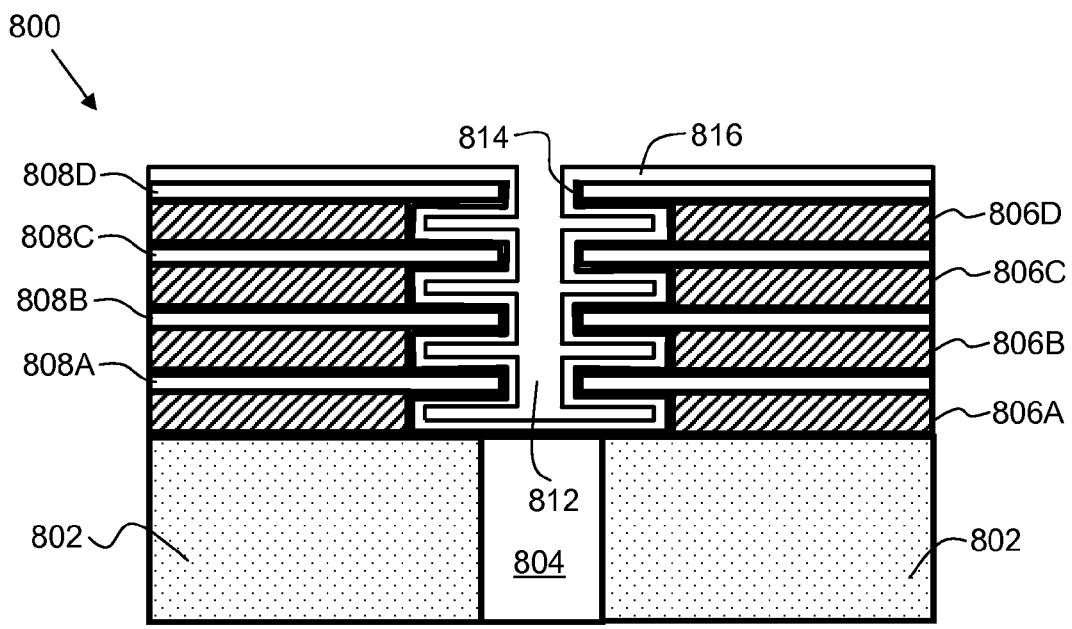

FIG. 8 shows a semiconductor structure 800 at a subsequent intermediate processing step. In this processing step, a high-K dielectric layer 816 is applied to the interior surface of trench 812, as well as to the top surface of topmost nitride layer 808D. In one embodiment, high-K dielectric layer 816 is comprised of hafnium oxide ($HfO_2$). In another embodiment, hafnium silicate is used as the high-K dielectric layer 816. In yet another embodiment, zirconium oxide is used as the high-K dielectric 816. In a preferred embodiment, the high-K dielectric layer 816 ranges in thickness from about 20 angstroms to about 50 angstroms, and is deposited via ALD. The high-K dielectric 816 preferably has a dielectric constant preferably ranging from about 15 to 20, but the dielectric constant of the high-K dielectric 816 can exceed 20.

Figure 9:
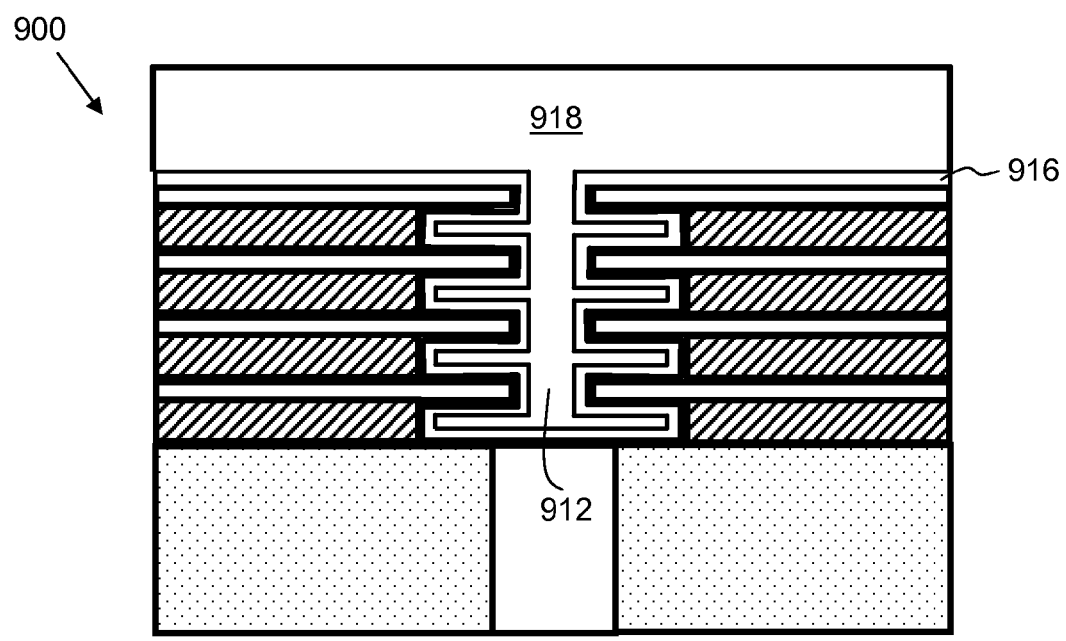

FIG. 9 shows a semiconductor structure 900 at a subsequent intermediate processing step. In this processing step, a second capacitor metal 918 is deposited on semiconductor structure 918, and enters trench 912. In one embodiment, second capacitor metal 918 is comprised of ruthenium or tantalum and is deposited via ALD.

Figure 10:
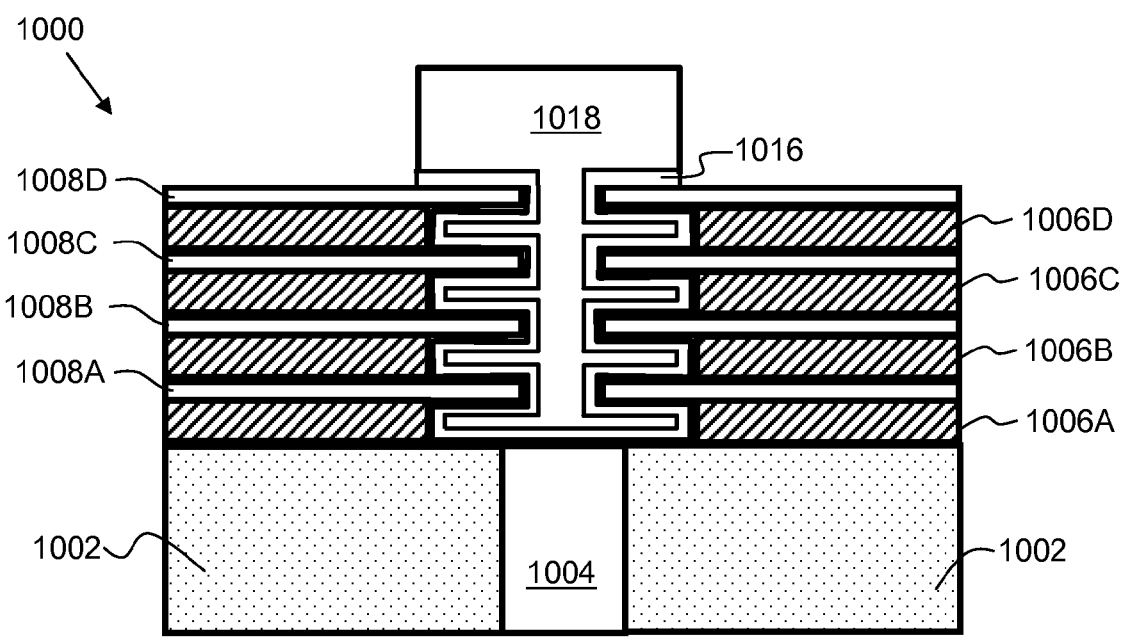

FIG. 10 shows a semiconductor structure 1000 at a subsequent intermediate processing step. In this processing step, second capacitor metal 1018 and high-K dielectric 1016 are formed by etching away excess material (compare with 916 and 918 of FIG. 9) such that only a portion of the second capacitor metal remains, which forms a second contact for the capacitor.

Figure 11A:
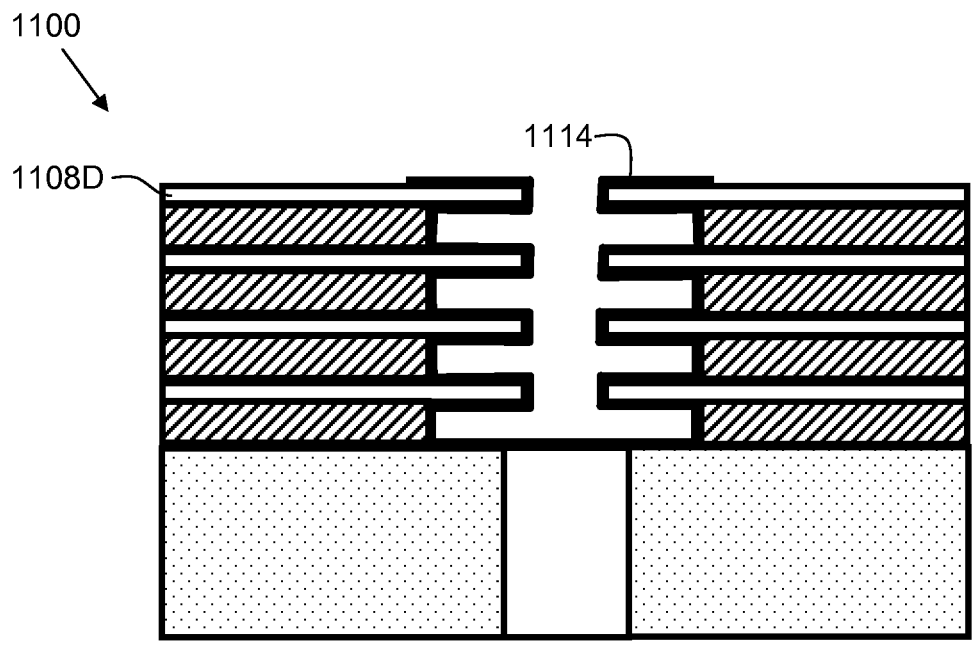
Figure 11B:
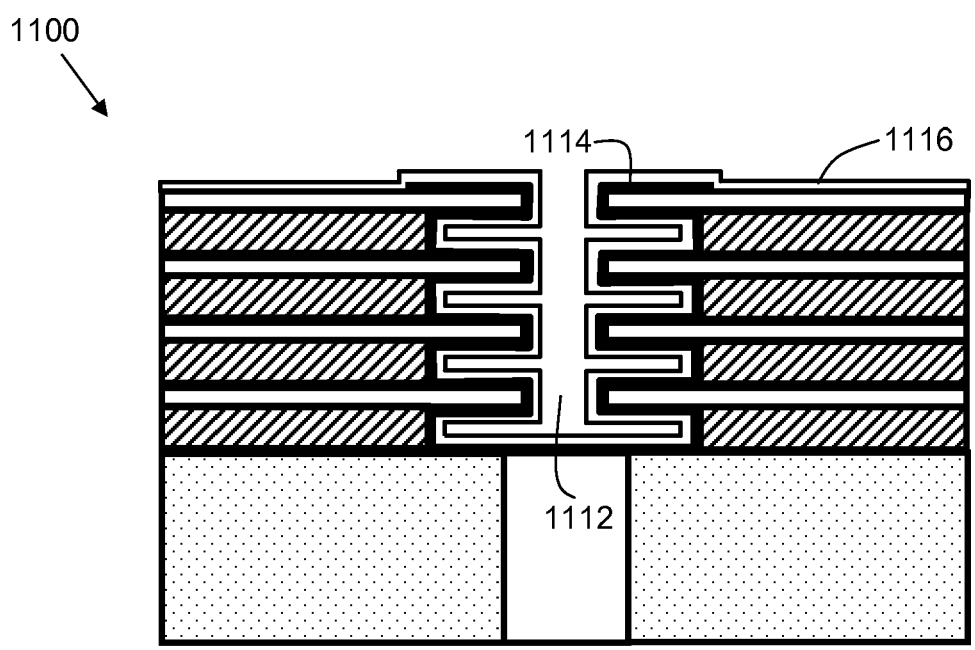
Figure 12:
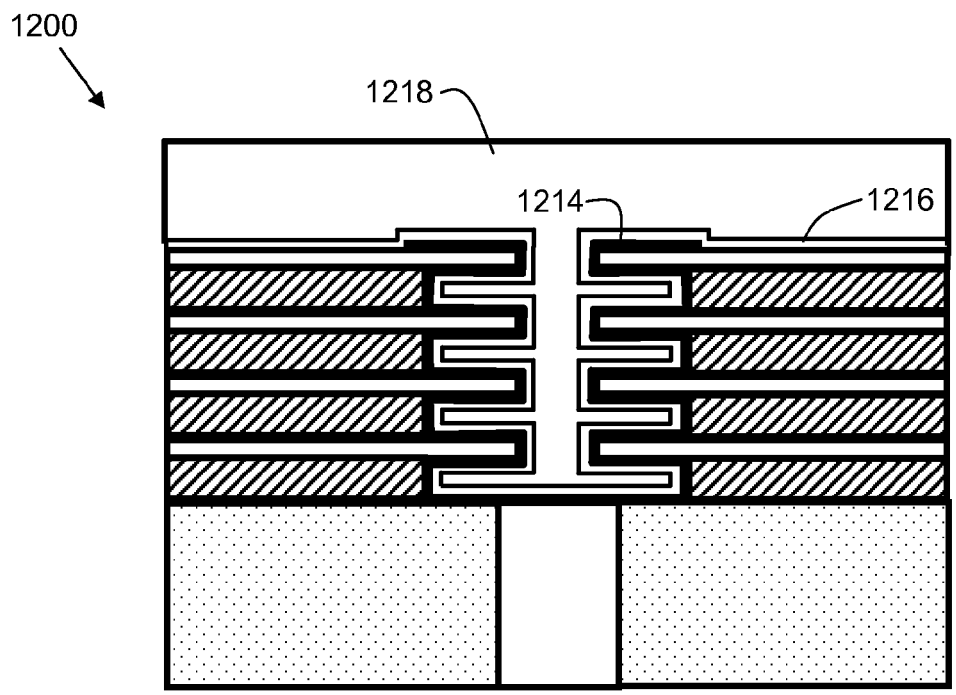
Figure 13:
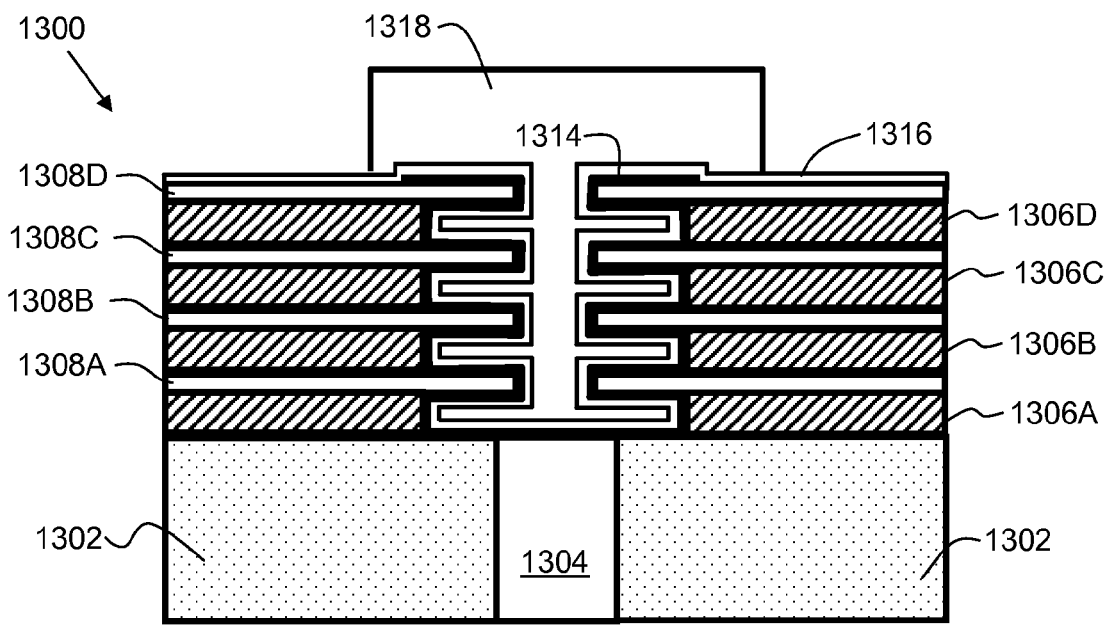

FIGS. 11-13 show a capacitor in accordance with an alternate embodiment of the present invention at various steps in the fabrication process. FIG. 11A shows a semiconductor structure 1100 of the alternate embodiment at a subsequent intermediate processing step which follows from FIG. 6. In this process step, first capacitor metal 1114 is lithographically etched, such that only a portion of first capacitor metal 1114 is present on the top surface of nitride layer 1108D. In this embodiment, the step of CMP of the first capacitor metal is eliminated (compare with FIG. 7). FIG. 11B shows a semiconductor structure 1100 of the alternate embodiment at a subsequent intermediate processing step. In this processing step, high-K dielectric 1116 is deposited in the trench 1112, as well as on the top surface of semiconductor structure 1100. The high-K dielectric 1116 is preferably deposited via ALD.

FIG. 12 shows a semiconductor structure 1200 of the alternate embodiment at a subsequent intermediate processing step. In this processing step, second capacitor metal 1218 is applied, preferably via ALD, similar to as described for FIG. 9.

FIG. 13 shows a semiconductor structure 1300 of the alternate embodiment at a subsequent intermediate processing step. In this processing step, the second capacitor metal 1318 is etched to form a second contact for the capacitor. The high-K dielectric 1316 remains on the top surface (above nitride layer 1308D) outside of the area covered by second capacitor metal 1318 in this embodiment, as compared with the embodiment shown in FIG. 10, which does not have high-K dielectric 1016 on the top surface of the nitride layer 1008D outside of the area covered by second capacitor metal 1018.

FIGS. 14 and 15 are flowcharts indicating process steps for methods in accordance with embodiments of the present invention. FIG. 14 shows flowchart 1400, which illustrates process steps for a method in accordance with an embodiment of the present invention. In process step 1462, an alternating layer of two types of nitrides is deposited. One sublayer is of a slow-etch nitride composition, with a very low wet etch rate. In one embodiment, the density of the slow-etch nitride is about 2.62 g/cc. Another sublayer of nitride is of a lower density, and thus, contains higher levels of NH bonds, which increases the etch rate. The pattern of the first and second sublayers may be repeated numerous times to form a nitride stack. In process step 1464 a mask (photoresist) is applied, and then a reactive ion etch (RIE) is performed to form a trench into the nitride stack. In process step 1466 the mask is removed via industry-standard methods, such as stripping or etching. In process step 1468 a wet etch is performed, preferably with HF (Hydrofluoric acid). The HF has a considerably different etch rate on the various sublayers of the nitride layer stack, forming a corrugated shape (first shown in FIG. 5). Optionally, a densifying anneal is performed at process step 1470. This anneal serves to drive out the Hydrogen, and it in effect "freezes" the corrugated shape, as the difference in HF etch rates between the fast and slow etch nitrides is reduced considerably. Therefore the corrugated shape is not very much affected by other fabrication steps, such as pre-cleans before the film depositions. The anneal can be used so long as the wafer substrate can tolerate the temperature exposure. In process step 1472, the first capacitor metal is deposited, preferably via ALD. In process step 1474, a fixed abrasive chemical mechanical polish (CMP) is performed. Process step 1474 preferably does not use slurry, which could potentially clog the trench or leave residues behind in the openings. In process step 1478, the high-K dielectric is deposited, preferably via ALD. In one embodiment, the high-K dielectric deposited during process step 1478 is hafnium oxide. In process step 1480, the second capacitor metal is deposited. In one embodiment, the metal deposited during process step 1480 is ruthenium or tantalum. However, other metals with sufficiently low resistivity for the given application may also be used. In process step 1482, the second capacitor metal is etched to form the second plate (electrode) of the capacitor.

FIG. 15 shows flowchart 1500, which illustrates process steps for a method in accordance with an embodiment of the present invention. In process step 1562, the nitride stack of alternating sublayers is formed. In process step 1564 a mask (photoresist) is applied and exposed, and then a reactive ion etch (RIE) is performed to form a trench into the nitride stack. In process step 1566 the mask is removed via industry-standard methods, such as stripping or etching. In process step 1568 a wet etch is performed, preferably with HF (Hydrofluoric acid). The HF has a considerably different etch rate on the various sublayers of the nitride layer stack, forming a corrugated shape (first shown in FIG. 5). Optionally, a densifying anneal is performed at process step 1570. In process step 1572, the first capacitor metal is deposited, preferably via ALD. In process step 1576, the first capacitor metal is lithographically etched. This is in contrast to the embodiment outlined in FIG. 14, which uses a CMP process to remove a portion of the first capacitor metal. The remainder of the process steps in FIG. 15 is similar to those in FIG. 14. In process step 1578, the high-K dielectric is deposited, preferably via ALD or any other nearly completely conformal deposition process. In one embodiment, the high-K dielectric deposited during process step 1578 is hafnium oxide. In process step 1480, the second capacitor metal is deposited. In process step 1582, a lithographic process defines the edges of the second capacitor metal, which is etched to form the second plate (electrode) of the capacitor.

FIG. 16 shows a prior art semiconductor structure 1600 as a starting point for an additional embodiment of the present invention. Semiconductor structure 1600 comprises a dielectric layer 1602, having a capacitor contact 1604 disposed within it. A second dielectric layer 1606 is disposed on top of dielectric layer 1602, and a cavity 1609 is formed within second dielectric layer 1606, exposing capacitor contact 1604 and a portion of dielectric layer 1602.

FIG. 17 shows a semiconductor structure 1700 after a subsequent process step of depositing a nitride layer stack 1701. Note that for FIGS. 16-30, often, similar elements may be referred to by similar numbers in various figures (FIGs) of the drawing, in which case typically the last two significant digits may be the same, the most significant digit(s) being the number of the drawing figure (FIG). For example, capacitor contact 1704 of FIG. 17 is similar to capacitor contact 1604 of FIG. 16.

Nitride layer stack 1701 is comprised of at least three layers of nitrides. Nitride layers 1708 and 1712 are fast-etch nitride layers, and nitride layer 1710 is a slow-etch nitride layer. The fast-etch layers 1708 and 1712 etch considerably faster in an HF solution than slow-etch nitride layer 1710. Slow-etch nitride layer 1710 is comprised of a typical nitride such as silicon nitride (Si3N4) having a low hydrogen content. Fast-etch nitride layers 1708 and 1712 are also Si3N4, but contains higher levels of hydrogen than slow-etch nitride layer 1710. Nitride layers 1708 and 1712 are similar to fast-etch nitride 106 discussed in FIG. 1. Nitride layer 1710 is similar to slow-etch nitride 108 discussed in FIG. 1. In one embodiment, layers 1708 and 1712 have a thickness in the range of 50 to 250 angstroms, and layer 1710 has a thickness in the range of 30 to 130 angstroms. The layers (1708, 1710, 1712) of nitride stack 1701 may be deposited via chemical vapor deposition (CVD) or atomic layer deposition (ALD).

FIG. 17B shows a semiconductor structure 1700B after a subsequent process step of depositing a nitride layer stack 1701B in accordance with an alternative embodiment of the present invention. Semiconductor structure 1700B is similar to semiconductor structure 1700 of FIG. 17, except that nitride layer stack 1701B is not comprised entirely of fast-etch and slow-etch nitrides. Instead, nitride layer stack 1701B uses conductive layer 1717 in place of the slow-etch nitride. Hence, layer stack 1701B is comprised of a conductive layer 1717 disposed between two fast-etch nitride layers 1708 and 1712. In one embodiment, conductive layer 1717 is a metal, such as tungsten, copper, or titanium.

FIG. 18 shows a semiconductor structure 1800 after a subsequent process step of etching the base of the nitride layer stack 1801, extending cavity 1809 to expose capacitor contact 1804 and a portion of dielectric layer 1802.

FIG. 19 shows a semiconductor structure 1900 after a subsequent process step of planarizing the semiconductor structure. This removes the layer stack (compare 1801 of FIG. 18) from the top of dielectric layer 1906. In one embodiment, the planarization is performed with a fixed abrasive chemical mechanical polish (CMP). Alternatively, the steps shown in FIGS. 18 and 19 may be swapped. That is, it is possible to planarize the semiconductor structure prior to etching the nitride layer stack as shown in FIG. 18.

FIG. 20 shows a semiconductor structure 2000 after a subsequent process step of depositing a metal plug 2011 into the semiconductor structure. Metal plug 2011 may be comprised of tungsten, and me be deposited via chemical vapor deposition (CVD). Alternatively, the steps shown in FIGS. 19 and 20 may be swapped. That is, it is possible to deposit the metal plug 2011 prior to the planarization step shown in FIG. 19, if so desired, so long as the nitride layer stack is etched (FIG. 18) prior to depositing the metal plug.

FIG. 21 shows a semiconductor structure 2100 after a subsequent process step of removing a portion of the nitride layer stack. In particular, nitride layers 2008 and 2012 (compare with FIG. 20) are now removed. In this processing step, a wet etch using HF (hydrofluoric acid) is applied to semiconductor structure 2000. Because of the different properties of the fast-etch nitride layers 2008 and 2012 as compared with slow-etch nitride layer 2010, the fast-etch nitride layers are removed, and the slow-etch nitride layer 2110 remains. In this cross-sectional view, it can be seen that layer 2110 has a non-linear cross-section, which increases the amount of surface area that is available to form a capacitor plate. In particular, nitride layer 2110 has an L-shaped cross section, although other shapes for the cross section are possible and within the scope of the present invention. The nitride layer 2110 is comprised of portion 2110A and portion 2011B. Portion 2011A extends perpendicularly from metal plug 2111 at an intermediate point along the metal plug, above the base 2111B of the metal plug, and below the top 2111T of the metal plug 2111. Portion 2011B is perpendicular to portion 2011A. The use of a non-linear nitride layer such as nitride layer 2110 increases the surface area of a capacitor plate, and thus, allows for capacitors with higher capacitance, without increasing the area requirements. The capacitance value of the capacitor may be controlled by altering the height of the dielectric layer 2106. A taller dielectric layer 2106 increases the capacitance by increasing the surface area of nitride layer 2110. In this way, the capacitance value can be tuned by the altering the height of dielectric layer 2106 prior to deposition of the nitride layer stack (e.g. 1701 of FIG. 17).

FIG. 22 shows a top-down view of the semiconductor structure 2100 of FIG. 21. From this view, it can be seen that slow-etch nitride layer 2110 is annular, and surrounds metal plug 2111. While slow-etch nitride layer 2110 is illustrated as circular in FIG. 22, it can also be oblong, or any other closed shape.

FIG. 23 shows a semiconductor structure 2300 after a subsequent process step of depositing a first metal layer 2316 over the semiconductor structure. Metal layer 2316 may be deposited via atomic layer deposition, and may be comprised of tungsten. Alternatively, metal layer 2316 may be comprised of ruthenium.

FIG. 24 shows a semiconductor structure 2400 after a subsequent process step of depositing a dielectric layer 2418 over the semiconductor structure. In one embodiment, dielectric layer 2418 is comprised of hafnium oxide. In one embodiment, the dielectric layer 2418 is deposited via atomic layer deposition (ALD).

FIG. 25 shows a semiconductor structure 2500 after a subsequent process step of depositing a second metal layer 2520 over the semiconductor structure. After second metal layer 2520 is deposited, it is patterned using standard lithographic methods. In one embodiment, the second metal layer 2520 is comprised of tungsten. The second metal layer 2520 may be deposited with atomic layer deposition (ALD). In another embodiment, metal layer 2520 may be deposited in a two-phase process. In phase 1, atomic layer deposition is used until metal layer 2520 reaches or exceeds the level of dielectric layer 2518. Then, in phase 2, chemical vapor deposition can be used to complete the deposition of metal layer 2520.

FIG. 26 shows a semiconductor structure 2600 after an optional subsequent process step of performing an isotropic etch of the second metal layer 2620. This recesses metal layer 2620 a distance D from the location of the edge of metal layer 2520 (see FIG. 25). In one embodiment, the distance D is in the range of 50 to 100 angstroms. This isotropic etch helps reduce the risk of defects due to shorting metal layer 2620 to metal layer 2618. By creating additional separation between metal layer 2618 and metal layer 2620, the risk of such defects is reduced, which in turn serves to improve manufacturing yield.

FIG. 27 shows a semiconductor structure 2700 after a subsequent process step from FIG. 23 of depositing a nitride stabilization layer 2724 for an alternative method of fabrication. This alternate method avoids the yield issues described for FIG. 26, and also eliminates the need for the isotropic etch shown in FIG. 26. In this alternative method of fabrication, a stabilization nitride layer 2724, comprised of fast-etch nitride is deposited for stabilizing the slow-etch nitride layer 2710 during a planarization step that follows.

FIG. 27B shows semiconductor structure 2700B after a subsequent process step from FIG. 27 of planarizing the nitride stabilization layer. The remaining nitride stabilization layer is indicated as portions 2724B, which serve to protect the slow-etch nitride layer 2710 during the planarization process, which may be performed with a chemical mechanical polish (CMP).

FIG. 28 shows a semiconductor structure 2800 after a subsequent process step from FIG. 27 of removing the nitride stabilization layer (see 2724 of FIG. 27) and first metal layer 2816 from the top surfaces of the semiconductor structure (compare with 2716 of FIG. 27).

FIG. 29 shows a semiconductor structure 2900 after a subsequent process step from FIG. 28, of depositing a dielectric layer 2918 over the semiconductor structure. In one embodiment, the dielectric layer 2918 is comprised of hafnium oxide.

FIG. 30 shows a semiconductor structure 3000 after a subsequent process step from FIG. 29, of depositing a second metal layer 3020 over the semiconductor structure. After second metal layer 3020 is deposited, it is patterned using standard lithographic methods. Since the first metal layer 3016 is removed from the top surfaces of semiconductor structure 3000, the risk of defects due to shorting of metal layer 3020 and metal layer 3018 has been greatly reduced.

FIG. 31 is a flowchart showing process steps for fabricating a capacitor in accordance with embodiments of the present invention. In process step 3150, the nitride layer stack is deposited (see 1701 of FIG. 17). In process step 3152, the nitride layer stack is deposited (see 1804 of FIG. 18). In process step 3154, the semiconductor structure is planarized (see FIG. 19). In process step 3156, a metal plug is deposited (see 2011 of FIG. 20). In process step 3158, the fast-etch layers of the nitride layer stack are removed (see FIG. 21). In the case of a nitride layer stack comprised of both fast-etch nitride and slow-etch nitride, such as 1701 of FIG. 17, the process proceeds to process step 3160. In the case of a nitride layer stack such as 1701B of FIG. 17B, the process proceeds to process step 3162, since the slow-etch layer 1717 of the nitride layer stack 1701B (see FIG. 17B) is a conductor.

In process step 3160, a first metal layer is deposited (see 2316 of FIG. 23). This metal forms the first plate of the capacitor. From process step 3160, there are two embodiments that may be used to complete fabrication of the capacitor.

For the first embodiment, the process proceeds to process step 3162. In process step 3162, a dielectric layer is deposited (see 2011 of FIG. 20). In one embodiment, this is a high-K dielectric layer comprised of hafnium oxide. In process step 3164, a second metal layer is deposited (see 2520 of FIG. 25). This metal forms the second plate of the capacitor. In process step 3166, optionally, an isotropic etch is performed on the second metal layer (see 2620 of FIG. 26).

For the second embodiment, the process proceeds from process step 3160 to process step 3170, where a stabilization layer is deposited (see 2724 of FIG. 27). The semiconductor structure is then planarized (see FIG. 28) in process step 3172. In process step 3174, a dielectric layer is deposited (see 2918 of FIG. 29). In process step 3176, a second metal layer is deposited (see 3020 of FIG. 30).

FIG. 32 shows a block diagram of an exemplary design flow 3200 used for example, in semiconductor IC logic design, simulation, test, layout, and manufacture. Design flow 3200 includes processes, machines and/or mechanisms for processing design structures or devices to generate logically or otherwise functionally equivalent representations of the design structures and/or devices described above and shown in FIGS. 1-31. The design structures processed and/or generated by design flow 3200 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 3200 may vary depending on the type of representation being designed. For example, a design flow 3200 for building an application specific IC (ASIC) may differ from a design flow 3200 for designing a standard component or from a design flow 3200 for instantiating the design into a programmable array, for example a programmable gate array (PGA) or a field programmable gate array (FPGA) offered by Altera® Inc. or Xilinx® Inc.

FIG. 32 illustrates multiple such design structures including an input design structure 3220 that is preferably processed by a design process 3210. Design structure 3220 may be a logical simulation design structure generated and processed by design process 3210 to produce a logically equivalent functional representation of a hardware device. Design structure 3220 may also or alternatively comprise data and/or program instructions that when processed by design process 3210, generate a functional representation of the physical structure of a hardware device. Whether representing functional and/or structural design features, design structure 3220 may be generated using electronic computer-aided design (ECAD) such as implemented by a core developer/designer. When encoded on a machine-readable data transmission, gate array, or storage medium, design structure 3220 may be accessed and processed by one or more hardware and/or software modules within design process 3210 to simulate or otherwise functionally represent an electronic component, circuit, electronic or logic module, apparatus, device, or system such as those shown in FIGS. 1-31. As such, design structure 3220 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 3210 preferably employs and incorporates hardware and/or software modules for synthesizing, translating, or otherwise processing a design/simulation functional equivalent of the components, circuits, devices, or logic structures shown in FIGS. 1-31 to generate a Netlist 3280 which may contain design structures such as design structure 3220. Netlist 3280 may comprise, for example, compiled or otherwise processed data structures representing a list of wires, discrete components, logic gates, control circuits, I/O devices, models, etc. that describes the connections to other elements and circuits in an integrated circuit design. Netlist 3280 may be synthesized using an iterative process in which netlist 3280 is resynthesized one or more times depending on design specifications and parameters for the device. As with other design structure types described herein, netlist 3280 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 3210 may include using a variety of inputs; for example, inputs from library elements 3230 which may house a set of commonly used elements, circuits, and devices, including models, layouts, and symbolic representations, for a given manufacturing technology (e.g., different technology nodes, 32 nm, 45 nm, 90 nm, etc.), design specifications 3240, characterization data 3250, verification data 3260, design rules 3270, and test data files 3285 (which may include test patterns and other testing information). Design process 3210 may further include, for example, standard circuit design processes such as timing analysis, verification, design rule checking, place and route operations, etc. One of ordinary skill in the art of integrated circuit design can appreciate the extent of possible electronic design automation tools and applications used in design process 3210 without deviating from the scope and spirit of the invention. The design structure of the invention is not limited to any specific design flow.

Design process 3210 preferably translates an embodiment of the invention as shown in FIGS. 1-31, along with any additional integrated circuit design or data (if applicable), into a second design structure 3290. Design structure 3290 resides on a storage medium in a data format used for the exchange of layout data of integrated circuits (e.g. information stored in a GDSII (GDS2), GL1, OASIS, or any other suitable format for storing such design structures). Design structure 3290 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-31. Design structure 3290 may then proceed to a stage 3295 where, for example, design structure 3290: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor capacitor comprising:
a first dielectric layer;
a second dielectric layer disposed over the first dielectric layer;
    a cavity formed within the second dielectric layer;
    a metal plug disposed within the cavity, the metal plug having a base and a top;
    a nitride layer having an L-shaped cross section, extending from the metal plug, wherein the nitride layer comprises a portion extending perpendicularly from the metal plug at an intermediate point along the metal plug, the intermediate point located above the base of the metal plug and below the top of the metal plug; and wherein the nitride layer is formed in a circular shape around the metal plug;
    a first metal layer disposed over the nitride layer;
a third dielectric layer disposed over the first metal layer; and a second metal layer disposed over the third dielectric layer.

2. The semiconductor capacitor of claim 1, wherein the nitride layer is comprised of a slow-etch nitride.

3. The semiconductor capacitor of claim 1, wherein the nitride layer has a thickness ranging from about 80 to about 120 angstroms.

4. The semiconductor capacitor of claim 1, wherein the first metal layer is comprised of tungsten.

5. The semiconductor capacitor of claim 1, wherein the first metal layer is comprised of ruthenium.

* * * * *